US012396180B2

United States Patent
Fratin et al.

(10) Patent No.: US 12,396,180 B2
(45) Date of Patent: Aug. 19, 2025

(54) PILLAR AND WORD LINE PLATE ARCHITECTURE FOR A MEMORY ARRAY

(71) Applicant: Micron Technology, Inc., Boise, ID (US)

(72) Inventors: Lorenzo Fratin, Buccinasco (IT); Enrico Varesi, Milan (IT); Paolo Fantini, Vimercate (IT); Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 477 days.

(21) Appl. No.: 17/819,569

(22) Filed: Aug. 12, 2022

(65) Prior Publication Data

US 2024/0057348 A1    Feb. 15, 2024

(51) Int. Cl.
*H10B 63/00* (2023.01)
*H10N 70/00* (2023.01)

(52) U.S. Cl.
CPC ......... *H10B 63/845* (2023.02); *H10N 70/066* (2023.02)

(58) Field of Classification Search
None
See application file for complete search history.

(56) References Cited

U.S. PATENT DOCUMENTS

| 10,593,730 | B1 | 3/2020 | Conti et al. |
| 11,282,895 | B2 | 3/2022 | Fantini et al. |

*Primary Examiner* — Anthony Ho
(74) *Attorney, Agent, or Firm* — Holland & Hart LLP

(57) ABSTRACT

Methods, systems, and devices for pillar and word line plate architecture for a memory array are described to support a memory array that may include a word line plate at each vertical level of the memory array, where the word line plate may be coupled with each memory cell of a word line tile at the respective level. The memory array includes multiple pillars, where each pillar includes two or more electrodes that run the vertical length of the pillar and which are separated by an insulating dielectric material. Each electrode of the pillar is coupled with a corresponding set of memory cells, with each memory cell located at a different level of the array. An electrode of the pillar mis addressed, along with a word line plate of the memory array, to access a memory cell associated with the electrode and word line plate.

5 Claims, 18 Drawing Sheets

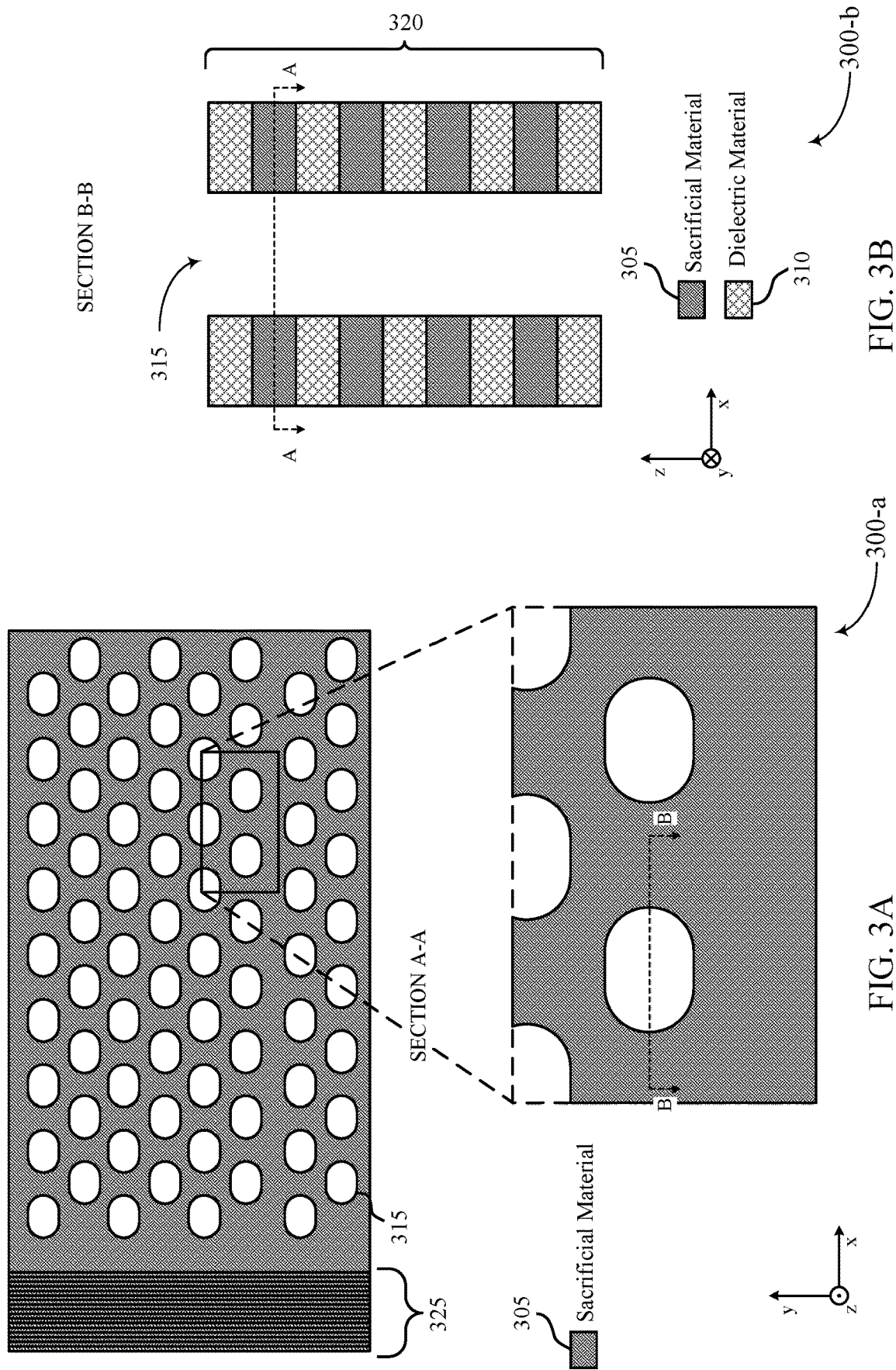

SECTION A-A

SECTION B-B

SECTION A-A

SECTION A-A

SECTION B-B

PILLAR AND WORD LINE PLATE ARCHITECTURE FOR A MEMORY ARRAY

FIELD OF TECHNOLOGY

The following relates to one or more systems for memory, including a pillar and word line plate architecture for a memory array.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 3A and 3B illustrate examples of memory architectures that support a pillar and word line plate architecture for a memory array in accordance with examples as disclosed herein.

DETAILED DESCRIPTION

Figure 1:
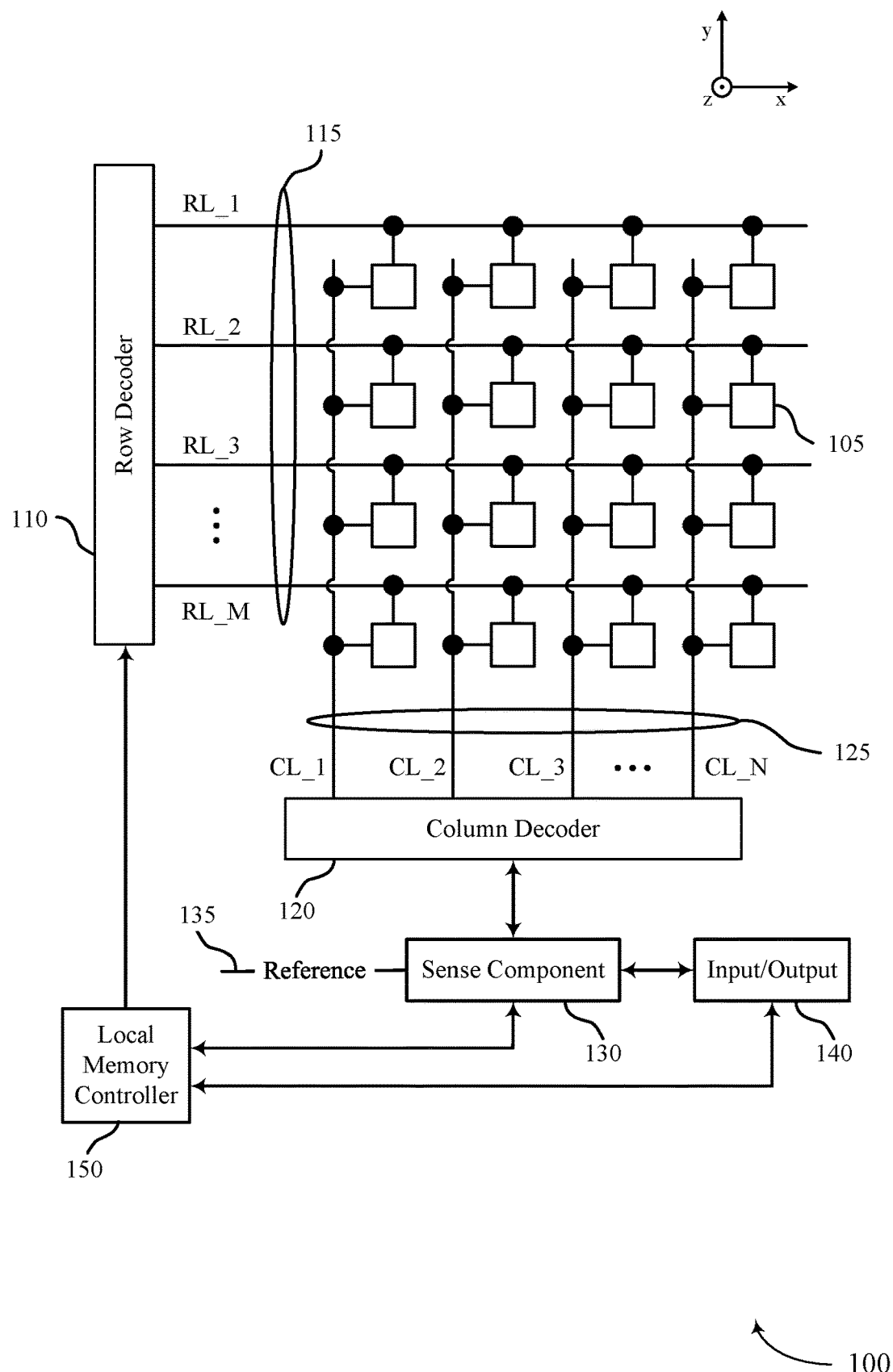
FIG. 1 illustrates an example of a memory array that supports a pillar and word line plate architecture for a memory array in accordance with examples as disclosed herein.

Memory array architectures for memory cells (e.g., chalcogenide or other resistive memory cells) may, in some cases, include pillars, such as electrode pillars, that extend vertically through a memory array. Each pillar may be coupled with a first set of memory cells on one side of the pillar, where each memory cell of the first set may be located at a different level (e.g., vertically spaced across multiple levels) of the memory array. Each pillar may also be coupled with a second set of memory cells on another side of the pillar, where each memory cell of the second may be located at a different level of the memory array (e.g., vertically spaced across multiple levels). At each level, a respective memory cell of the first set of memory cells may be coupled with a respective first word line of a respective first word line comb, and a memory cell of the second set of memory cells may be coupled with a respective second word line of a respective second word line comb. The word line combs may, in some examples, start at opposite ends of the memory array and may alternate with each other (e.g., may form interdigited word lines from alternating combs). In some cases, etching relatively deep recesses for pillars or trenches (e.g., trenches associated with the pillars) within the word line comb architecture, however, may result in longer manufacturing times, higher costs, lower memory array reliability, lower mechanical stability, or any combination thereof.

The present disclosure provides techniques for forming and using a memory array architecture that may include a word line plate at each level of the memory array, where the word line plate may be coupled with each memory cell of a word line tile at the respective level of the memory array (e.g., rather than word line combs that may be coupled with a subset, such as half, of the memory cells at the respective level). The word line plate structure will simplify manufacturing methods, which will reduce manufacturing time and cost, increase memory array reliability, provide other advantages, or any combination thereof. In order to maintain memory cell density, each pillar of the memory array may include two or more electrodes that may run the length of the pillar and which may be separated by an insulating dielectric material. For example, a first electrode of a pillar may be coupled with a first set of memory cells on a corresponding side of the pillar (e.g., which memory cells may be located at different levels of the array). A second electrode of the pillar may be coupled with a second set of memory cells on another side (e.g., a corresponding side) of the pillar (e.g., which memory cells may be located at different levels of the array). The electrodes of the pillar may be respectively addressed (e.g., by applying a voltage to the respective electrode), along with a word line plate of the memory array, to access a memory cell associated with the corresponding electrode and word line plate.

Features of the disclosure are initially described in the context of memory devices and arrays with reference to FIGS. 1 and 2A-2C. Features of the disclosure are described in the context of memory architectures and a memory array with reference to FIGS. 3A-16B. These and other features of the disclosure are further illustrated by and described with reference to flowcharts that relate to pillar and word line plate architecture for a memory array as described with reference to FIGS. 17 and 18.

FIG. 1 illustrates an example of a memory device 100 that supports a pillar and word line plate architecture for a memory array in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), sulfur (S), tellurium (Te), arsenic (As), antimony (Sb), tin (Sn), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or any combination thereof and such chalcogenide materials may be referred to as SiSAG-alloy or InSAG-alloy, respectively, or any combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

The memory device 100 may include any quantity of non-transitory computer readable media that support a pillar and word line plate architecture for a memory array. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

In some cases, a row line 115 may be represented by one or more word line plates (e.g., or a portion thereof), where each word line plate may be located at a respective vertical level of a memory array and may be coupled with each memory cell 105 of a corresponding word line tile at the respective level of the memory array. In some cases, a column line 125 may be represented by an electrode of a pillar (e.g., or one or more portions thereof), where each pillar may include two or more electrodes that run a vertical length of the pillar and which are separated by an insulating dielectric material. For example, a first electrode of a pillar may be coupled with a first set of memory cells 105 on a corresponding side of the pillar (e.g., which memory cells 105 may be located at different vertical levels of the array). A second electrode of the pillar may be coupled with a second set of memory cells 105 on another, corresponding side of the pillar (e.g., which memory cells 105 may be located at different vertical levels of the array). The electrodes of a pillar may be respectively addressed (e.g., by applying a voltage to the respective electrode), along with a word line plate of the memory array, to access a memory cell 105 associated with the corresponding electrode and word line plate.

Figure 2A:
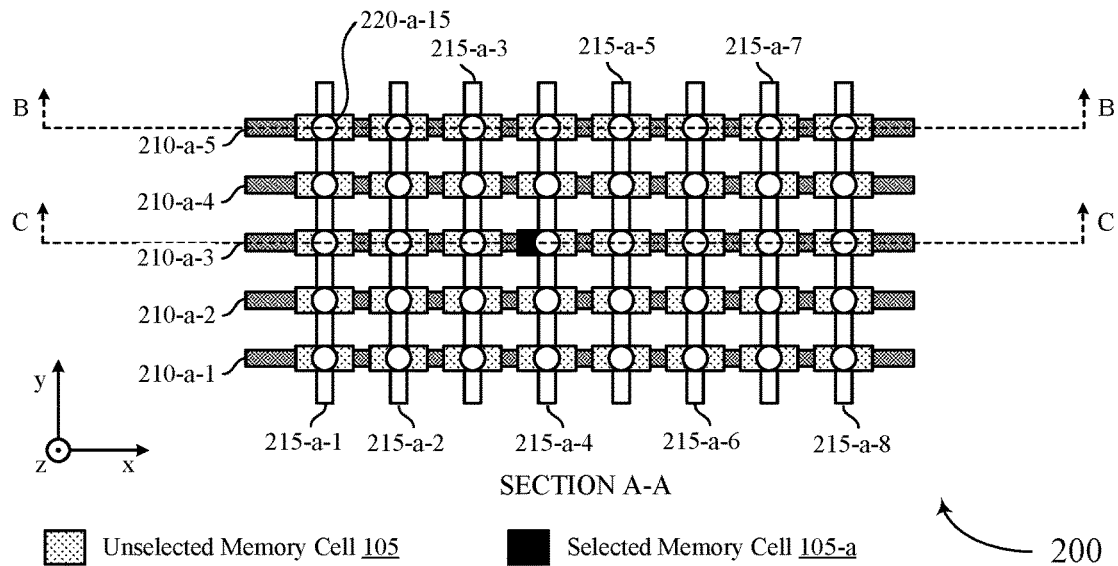
FIGS. 2A, 2B, and 2C illustrate an example of a memory array that supports a pillar and word line plate architecture for a memory array in accordance with examples as disclosed herein.
Figure 2B:
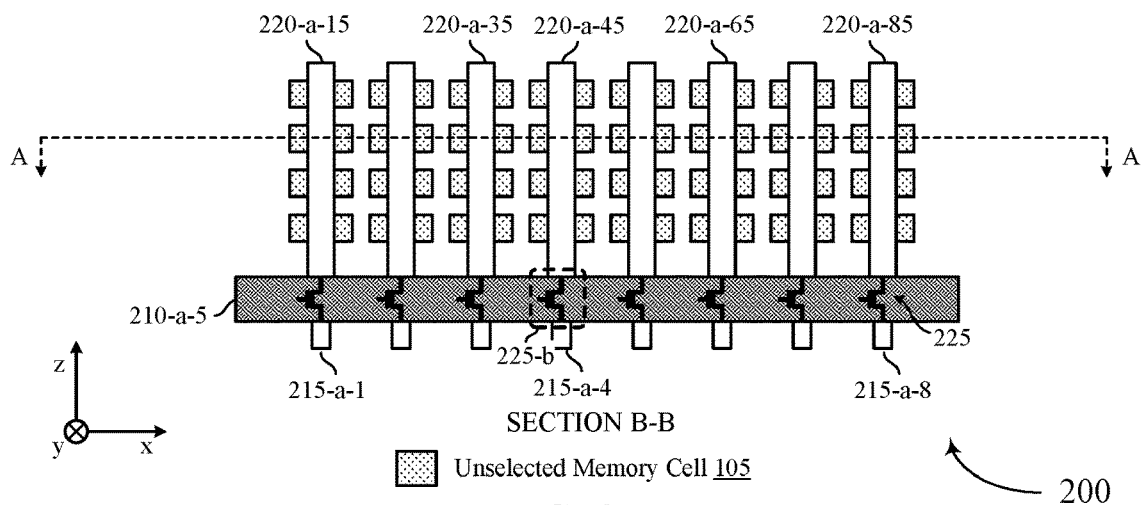
Figure 2C:
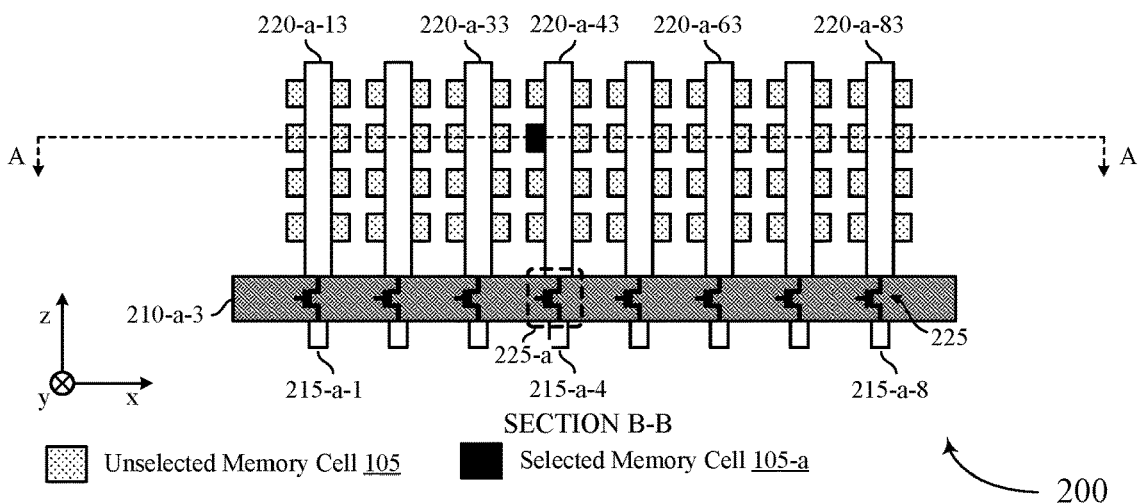

FIGS. 2A, 2B, and 2C illustrate an example of a memory array 200 that supports a pillar and word line plate architecture for a memory array in accordance with examples as disclosed herein. The memory array 200 may be included in a memory device 100, and illustrates an example of a three-dimensional arrangement of memory cells 105 that may be accessed by various conductive structures (e.g., access lines). FIG. 2A illustrates a top section view (e.g., SECTION A-A) of the memory array 200 relative to a cut plane A-A as shown in FIGS. 2B and 2C. FIG. 2B illustrates a side section view (e.g., SECTION B-B) of the memory array 200 relative to a cut plane B-B as shown in FIG. 2A. FIG. 2C illustrates a side section view (e.g., SECTION C-C) of the memory array 200 relative to a cut plane C-C as shown in FIG. 2A. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2A, 2B, and 2C. Although some elements included in FIGS. 2A, 2B, and 2C are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines (e.g., word line plates) may be distributed along the z-direction according to levels (e.g., decks, layers, planes, tiers, as illustrated in FIGS. 2B and 2C). Although not illustrated in FIGS. 2A-2C, word lines may be included in the memory array 200, and examples of word line structures may be given in FIGS. 3A-16B. In some examples, the z-direction may be orthogonal to a substrate (not shown) of the memory array 200, which may be below the illustrated structures along the z-direction. Although the illustrative example of memory array 200 includes four levels, a memory array 200 in accordance with examples as disclosed herein may include any quantity of one or more levels (e.g., 64 levels, 128 levels) along the z-direction. Each word line may be an example of a portion of an access line that is formed by one or more conductive materials (e.g., one or more metal portions, one or more metal alloy portions).

Each pillar 220 may be an example of a respective portion of one or more access lines (e.g., conductive pillar portion) that are formed by one or more conductive materials (e.g., one or more metal portions, one or more metal alloy portions). For example, each pillar 220 may include two or more electrodes (e.g., conductive portions), which may be respectively addressable to access memory cells coupled with the corresponding electrode of the pillar 220.

As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line (e.g., a level selection, which may include an even or odd selection within a level) and an electrode of pillar 220. For example, as illustrated, a selected memory cell 105-*a* of the level may be accessed according to an intersection between an electrode of the pillar 220-*a*-43 and a word line.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line with a first voltage (e.g., $V_{access}/2$) and by biasing a selected electrode of a pillar 220 with a second voltage (e.g., $-V_{access}/2$), which may have an opposite sign relative to the first voltage. Regarding the selected memory cell 105-*a*, a corresponding access bias (e.g., the first voltage) may be applied to a word line, while other unselected word lines may be grounded (e.g., biased to 0V). In some examples, a word line bias may be provided by a word line driver (not shown) coupled with one or more of the word lines.

To apply a corresponding access bias (e.g., the second voltage) to an electrode of a pillar 220, each electrode of a pillar 220 may be configured to be selectively coupled with a respective sense line 215 (e.g., a digit line, a column line, an access line extending along the y-direction) via a respective transistor 225 (e.g., selector device) coupled between (e.g., physically, electrically) the electrode of the pillar 220 and the sense line 215. As such, each pillar 220 may be associated with a quantity of transistors 225 and a quantity of sense lines 215 that corresponds to a quantity of electrodes of the pillar 220 (e.g., one electrode and one corresponding transistor 225 and sense line 215, two electrodes and two corresponding transistors 225 and sense lines 215). In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar electrode, a selected sense line 215, or any combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillar electrodes may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillar electrodes, or sense lines 215, or various combinations thereof, may be supported by a column decoder 120, or a sense component 130, or both.

To apply the corresponding access bias (e.g., $-V_{access}/2$) to an electrode of pillar 220-*a*-43, the sense line 215-*a*-4 may be biased with the access bias, and the gate line 210-*a*-3 may be grounded (e.g., biased to 0V) or otherwise biased with an activation voltage. In an example where the transistors 225 are n-type transistors, the gate line 210-*a*-3 being biased with a voltage that is relatively higher than the sense line 215-*a*-4 may activate the transistor 225-*a* (e.g., cause the transistor 225-*a* to operate in a conducting state), thereby coupling the electrode of the pillar 220-*a*-43 with the sense line 215-*a*-4 and biasing the electrode of the pillar 220-*a*-43 with the associated access bias. However, the transistors 225 may include different channel types, or may be operated in accordance with different biasing schemes, to support various access operations.

In some examples, unselected pillars 220 (e.g., pillar electrodes) of the memory array 200 may be electrically floating when the transistor 225-*a* is activated, or may be coupled with another voltage source (e.g., grounded, via a high-resistance path, via a leakage path) to avoid a voltage drift of the pillars 220 (e.g., pillar electrodes). For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (e.g., which may be biased with a ground voltage or may be floating). Further, other unselected gate lines 210, including gate line 210-*a*-5 as shown in FIG. 2B, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-*b* coupled with the gate line 210-*a*-5 may be deactivated (e.g., operating in a non-conductive state), thereby isolating the voltage of the sense line 215-*a*-4 from electrode(s) of the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In some cases, a memory array 200 may include a word line plate at each level of the memory array 200, where a word line plate may be coupled with each memory cell of a word line tile at the respective level of the memory array 200. In some cases, each pillar 220 of the memory array 200 may include two or more electrodes that run the length of the pillar 220 and which are separated by an insulating dielectric material. For example, a first electrode of a pillar 220 may be coupled with a first set of memory cells 105 on a corresponding side of the pillar 220 (e.g., which memory cells may be located at different levels of the array). A second electrode of the pillar 220 may be coupled with a second set of memory cells 105 on another, corresponding side of the pillar 220 (e.g., which memory cells may be located at different levels of the memory array 200). The electrodes of the pillar 220 may be respectively addressed (e.g., by applying a voltage to the respective electrode), along with a word line plate of the memory array 200, to access a memory cell 105 associated with the corresponding electrode and word line plate.

FIGS. 3A and 3B illustrate examples of memory architectures 300-*a* and 300-*b* that support a pillar and word line plate architectures for a memory array in accordance with examples as disclosed herein. For example, FIGS. 3A and 3B may illustrate different views of one or more architectures used in formation of a 3D memory array, which may be an example of a 3D memory array in accordance with examples as disclosed herein, such as with reference to FIGS. 1-2C. Memory architectures 300-*a* and 300-*b* may include multiple materials stacked in a vertical direction (e.g., z-direction), relative to a substrate, which may form a stack 320 (e.g., a stack of materials). Aspects of the memory architectures 300-*a* and 300-*b* may be described with reference to an x-direction, a y-direction, and a z-direction of the illustrated coordinate systems.

As described herein with reference to at least FIGS. 1-3B, a memory array may include word lines and pillars (e.g., bit line pillars). For example, in some cases, a memory array may include one or more word line combs, where multiple word lines may be arranged in a "comb" structure. The comb structure may, for example, be a structure that may include a first portion of a word line electrode material extending in a first direction in a plane and multiple "fingers" of the word line material coupled with and extending out from the first portion of the word line electrode material in the plane (e.g., in a second direction), with a space between each pair of adjoining fingers. Each finger of the word line comb may represent a word line as described herein. A quantity of fingers (e.g., word lines) and a length of the fingers may define a size of a word line comb.

A pillar may represent an electrode that may extend vertically through an array. Each pillar may be coupled with a first set of memory cells on one side of the pillar, where each memory cell of the first set may be located at a respective vertical level of the memory array. Each pillar may also be coupled with a second set of memory cells on another side of the pillar, where each memory cell of the second set may be located at a respective vertical level of the memory array (e.g., located on same respective levels as the first set of memory cells). At each level, a memory cell of the first set of memory cells may be coupled with a respective first word line of a first word line comb, and a memory cell of the second set of memory cells may be coupled with a respective second word line of a second word line comb. Each word line at a respective level of the memory array may, for example, be associated with the first word line comb or the second word line comb, where the first and second word line combs may face in opposite directions and may include alternating word lines (e.g., interdigited, alternating word lines from the first and second combs, respectively).

In some cases, pillars may be formed in association with (e.g., before, after, concurrently) forming the word line combs by etching recesses (e.g., holes, trenches, or both) vertically into the memory array and forming pillar electrode material in the holes. Such recesses for the pillars may have a relatively large aspect ratio, for example, based on the pillars having a relatively smaller diameter and a relatively larger vertical length through the array. In some cases, etching such relatively deep recesses (e.g., in comparison to recess width) in relation to the word line comb architecture may result in longer manufacturing times, higher costs, lower memory array reliability, or any combination thereof.

According to the techniques described herein, a memory array architecture may include a word line plate at each level of the memory array, where a respective word line plate may be coupled with each memory cell at the corresponding level of the memory array (e.g., rather than being coupled with half, or a subset, of the memory cells at that level). This word line plate structure may simplify manufacturing methods, which may reduce manufacturing time and cost, increase memory array reliability, or any combination thereof. In order to maintain a memory cell density with one word line plate at each level, each pillar of the memory array may include two electrodes (e.g., instead of one electrode) which are electrically isolated from each other based on being separated by an electrically insulating dielectric material. A first electrode of the pillar may be coupled with a first set of memory cells on a corresponding side of the pillar (e.g., which memory cells may each be located at a respective level of the array). A second electrode of the pillar may be coupled with a second set of memory cells on another, corresponding side of the pillar (e.g., which memory cells may also each be located at a respective level of the array). The first electrode and second electrode of a respective pillar may each be coupled with a corresponding selector device (e.g., a thin film transistor (TFT)) for selecting the electrode.

In order to form such a memory array architecture, a stack 320 of alternating materials may be formed above a substrate. The stack 320 may be shown from a cross sectional side view (e.g., in the y-direction) of section B-B in FIG. 3B, where the cross sectional side view may correspond to line B-B in FIG. 3A. Similarly, the stack may be shown from a cross sectional top view (e.g., in the z-direction) of section A-A in FIG. 3A, where the cross sectional top view may correspond to line A-A in FIG. 3B.

The stack 320 may include multiple tiers or levels of materials, which may be formed via one or more processing steps. For example, the stack may include a sacrificial material 305 and a dielectric material 310 (e.g., an oxide material, such as silicon oxide ($SiO_2$)), which may be formed alternatively one above another such that these materials alternate within the stack 320. The sacrificial material 305 may represent a placeholder material associated with the eventual formation of the word line plates. The sacrificial material 305 may assist in the formation of the memory array, and may be replaced during manufacturing by an electrode material for the word line plates, which may have a similar shape and structure within the array as the sacrificial material 305. As such, the dielectric materials 310 of the stack 320 may electrically insulate the word line plates from other word line plates in the stack.

In some examples, the sacrificial material 305 associated with the word line plates may include or be a nitride material, such as silicon nitride (SiN). As shown in the cross sectional top view of FIG. 3A, the sacrificial materials 305 of the stack may have different lengths in the x-direction, which may form a staircase region 325 at the left of the stack 320 (e.g., in the x-direction).

The staircase region 325 may correspond to the formation (e.g., eventual formation, such as by one or more processes) of a staircase for the word line plates of the memory array, which staircase may support a respective electrical contact (e.g., connection) for each word line plate. In some cases, the staircase region 325 may be unidirectional, and may be associated with the stack 320. In some cases, a mirrored stack 320 may be formed to the left of the stack 320 (e.g., in the x-direction), where the mirrored stack 320 may be the reverse of the stack 320 in the x-y plane and may thus have a staircase region 325 to the right of the mirrored stack 320 (e.g., in the x-direction). In such cases, a bidirectional staircase region 325 may exist between the stack 320 and the mirrored stack 320, such that the bidirectional staircase region 325 may support the formation of a bidirectional staircase for the word line plates of the stack 320 and the mirrored stack 320 (e.g., a staircase extending out in two directions, in each direction to the respective stack 320).

Multiple holes 315 may be formed (e.g., etched) through the stack 320 (e.g., in the vertical direction, z-direction) by removing the materials of the stack 320 at the holes 315, where the pillars of the memory array may be formed in the holes 315 (e.g., eventually formed in the holes 315, such as after one or more processing steps). Each hole 315 may extend through the stack 320 in the vertical direction (e.g., z-direction) and may have a cross sectional shape (e.g., in the x-y plane) of an oval or other shape. In some cases, the oval shape may support formation of the two electrodes of the pillar.

Figure 4A:
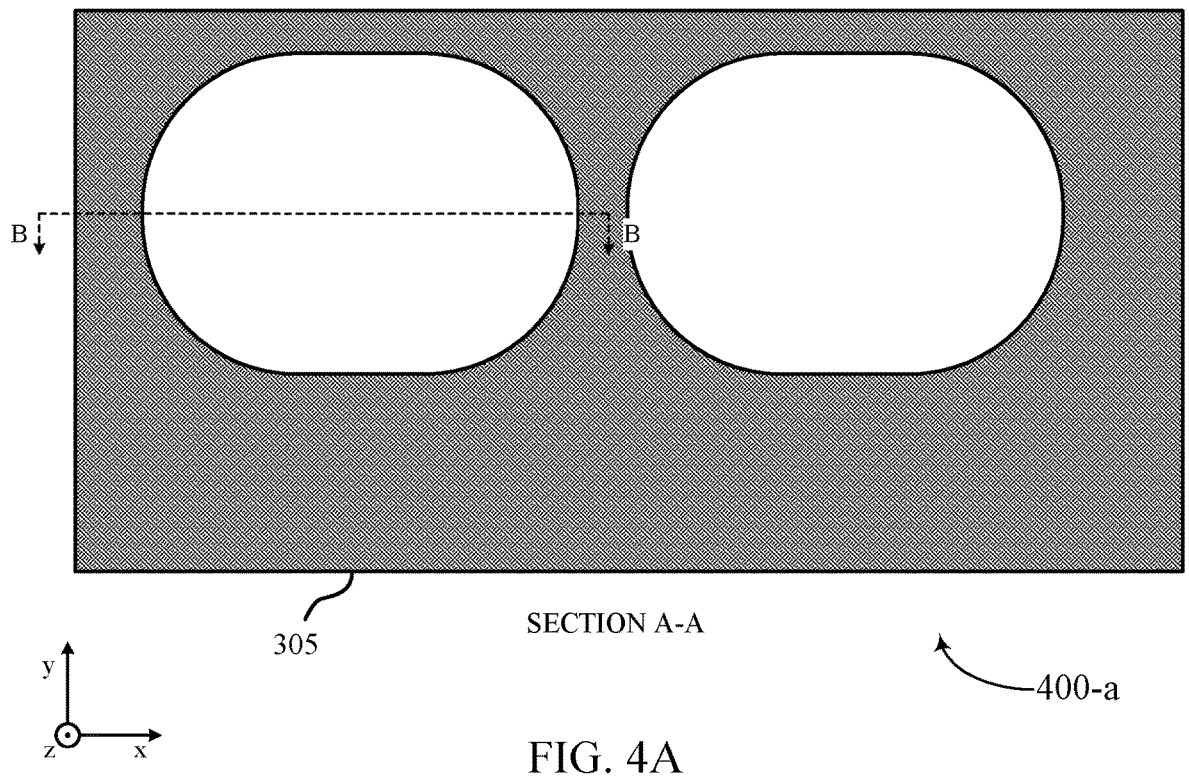
FIGS. 4A and 4B illustrate examples of memory architectures that support a pillar and word line plate architecture for a memory array in accordance with examples as disclosed herein.
Figure 4B:
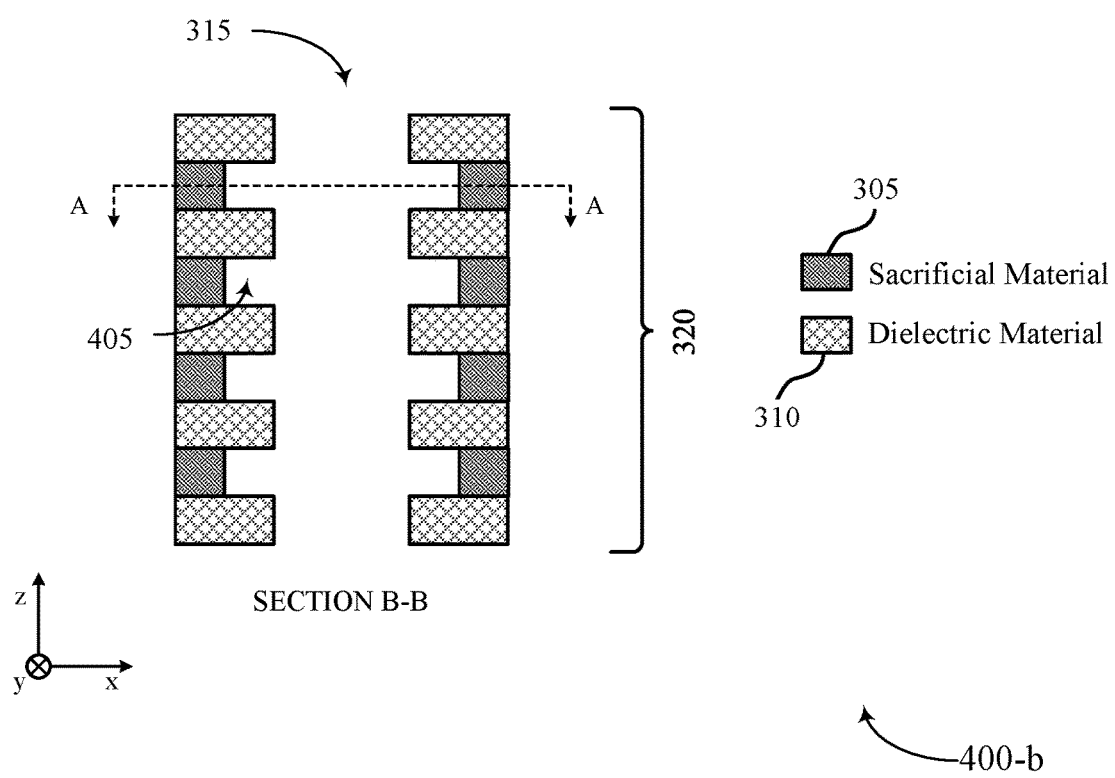

FIGS. 4A and 4B illustrate examples of memory architectures 400-a and 400-b that support a pillar and word line plate architecture for a memory array in accordance with examples as disclosed herein. For example, FIGS. 4A and 4B may illustrate different views of one or more architectures used in formation of a 3D memory array, which may be an example of a 3D memory array in accordance with examples as disclosed herein, such as with reference to FIGS. 1-3B. Memory architectures 400-a and 400-b may represent a continuation of the memory architectures 300-a and 300-b described with reference to FIGS. 3A and 3B. For example, memory architectures 400-a and 400-b may represent one or more additional processing steps performed in relation to memory architectures 300-a and 300-b and may be included in a same memory device (e.g., may represent one or more fabrication steps or processes associated with the memory device). As described with reference to FIGS. 3A and 3B, memory architectures 400-a and 400-b may include multiple materials stacked in a vertical direction (e.g., z-direction), relative to a substrate, which may form a stack 320 (e.g., a stack of materials).

The stack may include multiple holes 315, which, together with the stack 320, may be illustrated in a cross sectional top view (e.g., in the z-direction) of section A-A in FIG. 4A, where the cross sectional top view may correspond to line A-A in FIG. 4B. Similarly, the stack 320 and a hole 315 may be shown from a cross sectional side view (e.g., in the y-direction) of section B-B in FIG. 4B, where the cross sectional side view may correspond to line B-B in FIG. 4A. Aspects of the memory architectures 400-*a* and 400-*b* may be described with reference to an x-direction, a y-direction, and a z-direction of the illustrated coordinate systems, which may correspond to the respective directions described with reference to the memory architectures 300-*a* and 300-*b*.

In one or more processes, the sacrificial material 305 may be removed (e.g., etched, exhumed) to form recesses 405 within the stack 320. For example, the sacrificial material 305 may be selectively etched to form a respective recess 405 at each layer of sacrificial material 305, where each recess 405 may surround and connect with a respective hole 315. In one example, the etching process may be a wet etching process that may include applying one or more chemicals (e.g., via the holes 315) to selectively etch (e.g., remove) the sacrificial material 305 and not the dielectric material 310 (e.g., or may remove relatively small amounts of the dielectric material 310). The wet etching process may be applied for a defined amount of time, for example, in order to etch the recesses 405 in the sacrificial material 305 to a desired depth (e.g., where the depth may correspond to the amount of time). In some cases, the desired depth for the recesses 405 in the sacrificial material 305 may be associated with a dimension for one or more memory cells (e.g., where a respective memory cell may be formed in at least a portion of a recess 405).

Based on the removal of the sacrificial material 305 and the formation of the recesses 405, the sacrificial material 305 may recede in terms of area or volume comparison to the dielectric material 310, for example, as shown in FIG. 4B. Similarly, the holes in each layer of sacrificial material 305 may expand as illustrated in FIG. 4A, for example, based on formation of the recesses connected to the original holes 315.

Figure 5A:
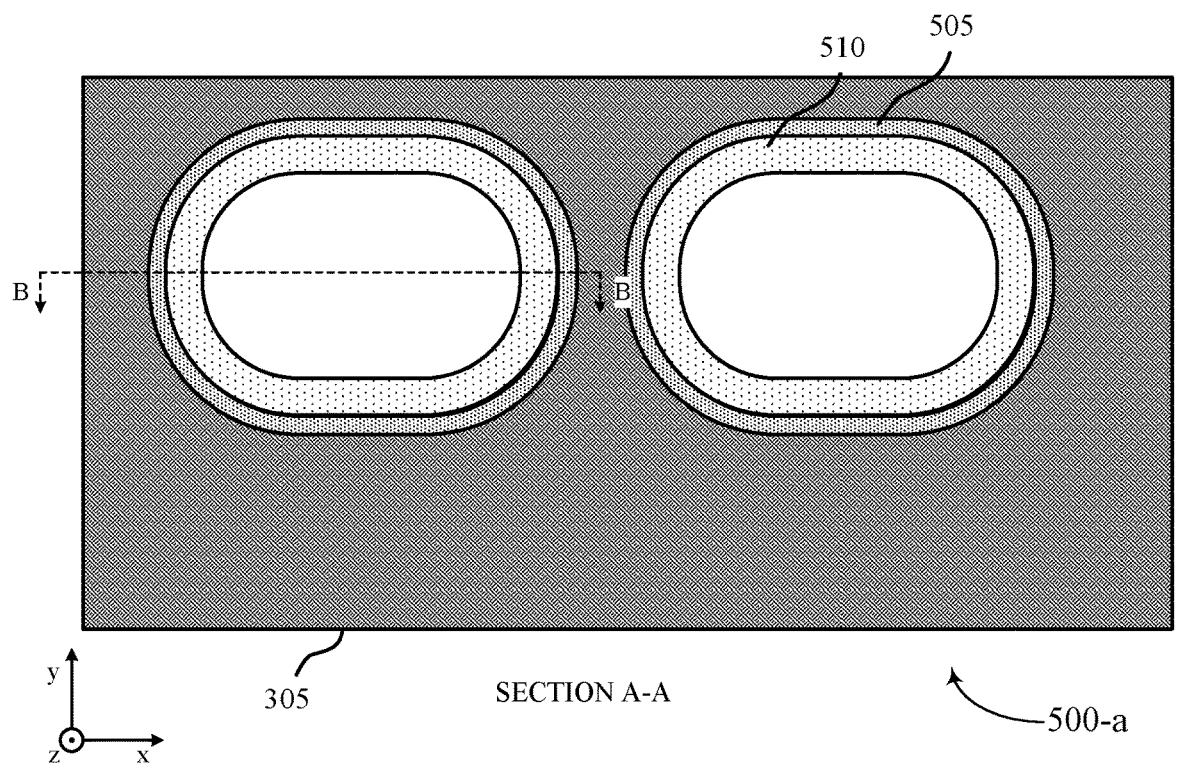
FIGS. 5A and 5B illustrate examples of memory architectures that support a pillar and word line plate architecture for a memory array in accordance with examples as disclosed herein.
Figure 5B:
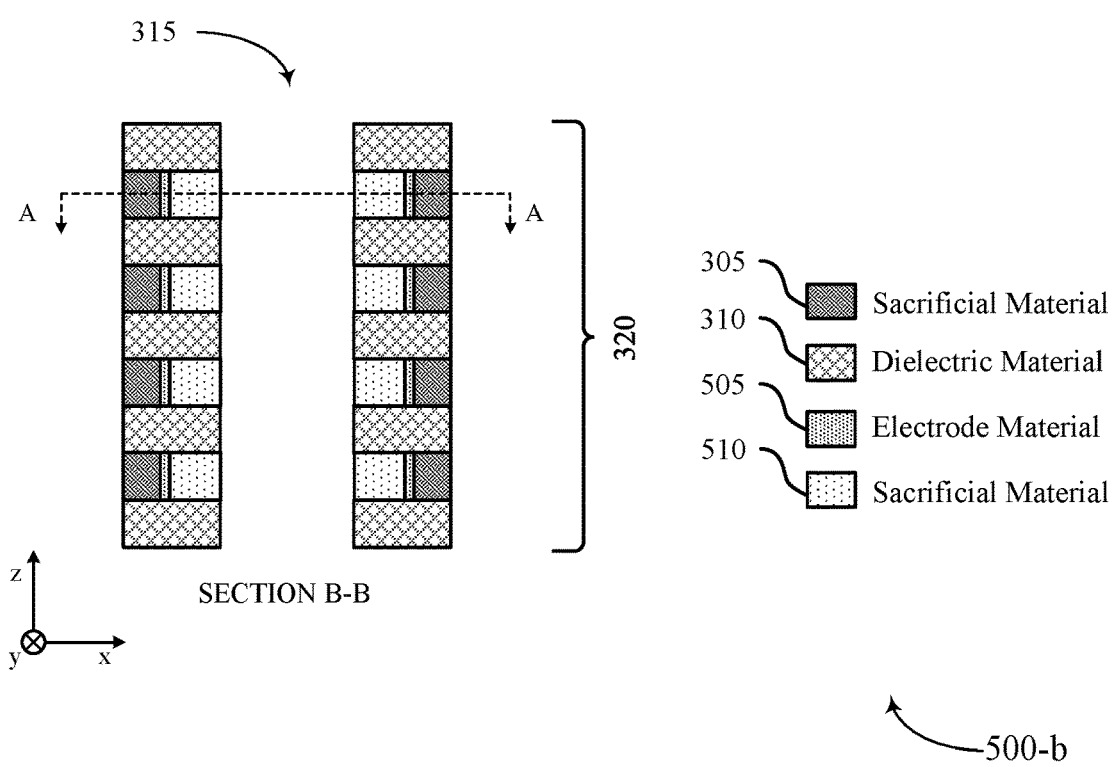

FIGS. 5A and 5B illustrate examples of memory architectures 500-*a* and 500-*b* that support a pillar and word line plate architecture for a memory array in accordance with examples as disclosed herein. For example, FIGS. 5A and 5B may illustrate different views of one or more architectures used in formation of a 3D memory array, which may be an example of a 3D memory array in accordance with examples as disclosed herein, such as with reference to FIGS. 1-4B. Memory architectures 500-*a* and 500-*b* may represent a continuation of the memory architectures 400-*a* and 400-*b* described with reference to FIGS. 4A and 4B. For example, memory architectures 500-*a* and 500-*b* may represent one or more additional processing steps performed in relation to memory architectures 400-*a* and 400-*b* and may be included in a same memory device (e.g., may represent one or more fabrication steps or processes associated with the memory device). As described with reference to FIGS. 4A and 4B, memory architectures 500-*a* and 500-*b* may include multiple materials stacked in a vertical direction (e.g., z-direction), relative to a substrate, which may form a stack 320 (e.g., a stack of materials).

The stack may include multiple holes 315, which, together with the stack 320, may be illustrated in a cross sectional top view (e.g., in the z-direction) of section A-A in FIG. 5A, where the cross sectional top view may correspond to line A-A in FIG. 5B. Similarly, the stack 320 and a hole 315 may be shown from a cross sectional side view (e.g., in the y-direction) of section B-B in FIG. 5B, where the cross sectional side view may correspond to line B-B in FIG. 5A. Aspects of the memory architectures 500-*a* and 500-*b* may be described with reference to an x-direction, a y-direction, and a z-direction of the illustrated coordinate systems, which may correspond to the respective directions described with reference to the memory architectures 400-*a* and 400-*b*.

As described with reference to FIGS. 4A and 4B, the memory architectures 400-*a* and 400-*b* may have previously undergone an etching process, in which the sacrificial material 305 may be etched to a defined depth to form a respective recess at each layer of sacrificial material 305, where each recess may be around and connected with a corresponding hole 315. Following formation of the recesses, an electrode material 505 (e.g., carbon (C), silicon carbide (SiC), titanium nitride (TiN), or one or more other conductive materials having properties that may preserve memory cell properties) may be deposited (e.g., conformally deposited, layered) in a respective ring within each recess and next to the sacrificial material 305, up to a defined depth (e.g., forming a width of the ring). For example, the electrode material 505 may be deposited in each recess and may be etched back (e.g., selectively etched) to the defined depth via a selective etching process (e.g., wet etch). In some cases, each ring of electrode material 505 may be configured to act as an interface between one or more memory cells and the word line plate at a respective level of the memory array.

Following formation of the electrode material 505, a sacrificial material 510 may be deposited (e.g., conformally deposited, layered) in a respective ring within each recess and next to the electrode material 505, up to a defined depth (e.g., forming a width of the ring). In some cases, the sacrificial material 510 may be aligned with the dielectric material 310 above and below the sacrificial material 510, such that the hole 315 may return to its original shape (e.g., or to a shape similar to its original shape). For example, the sacrificial material 510 may be deposited in each recess and may be etched back (e.g., selectively etched) to the defined depth via a selective etching process (e.g., wet etch). The sacrificial material 510 may be configured as a placeholder for one or more memory cells and may, for example, be removed at another step in the manufacturing process to form the memory cells and related portions of the memory array. In some cases, the sacrificial material 510 may be different from the sacrificial material 305. For example, the sacrificial material 510 may be or include an aluminum oxide (AlO) material.

In some cases, the electrode materials 505 and the sacrificial materials 510 may be formed via a layered deposition process or a selective deposition process. For example, the electrode materials 505 and the sacrificial materials 510 may be formed via an atomic layer deposition (ALD) process, in which successive layers of material may be deposited on top of one another.

Figure 6A:
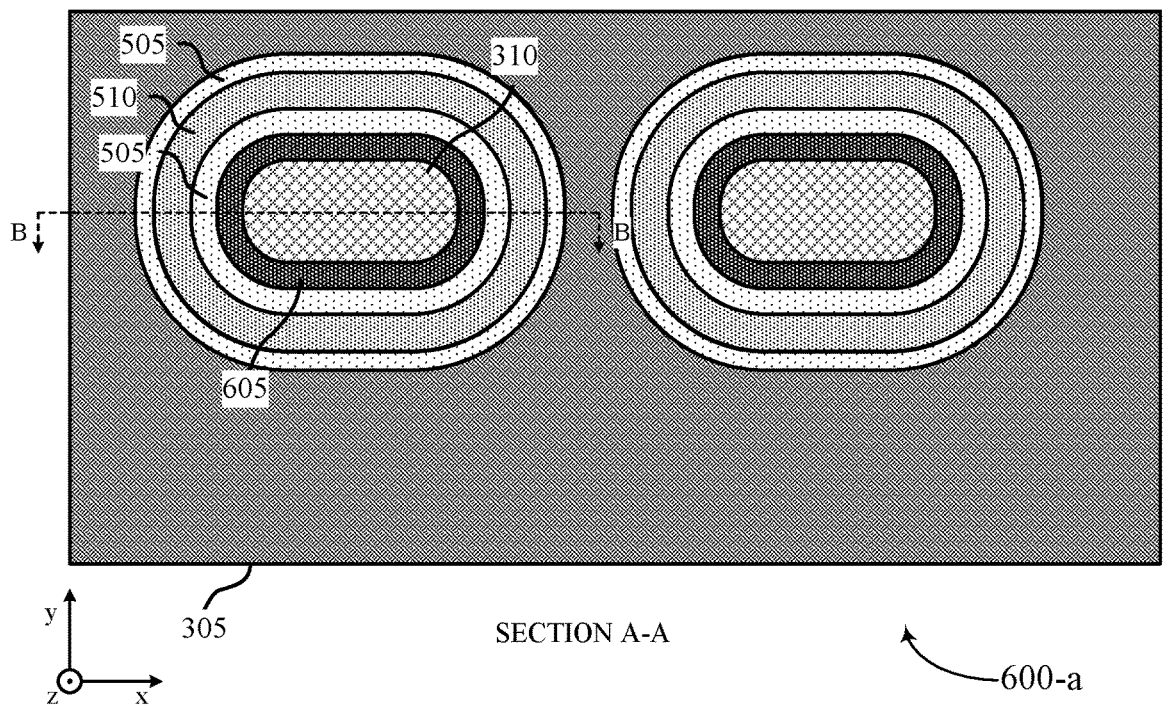
FIGS. 6A and 6B illustrate examples of memory architectures that support a pillar and word line plate architecture for a memory array in accordance with examples as disclosed herein.
Figure 6B:
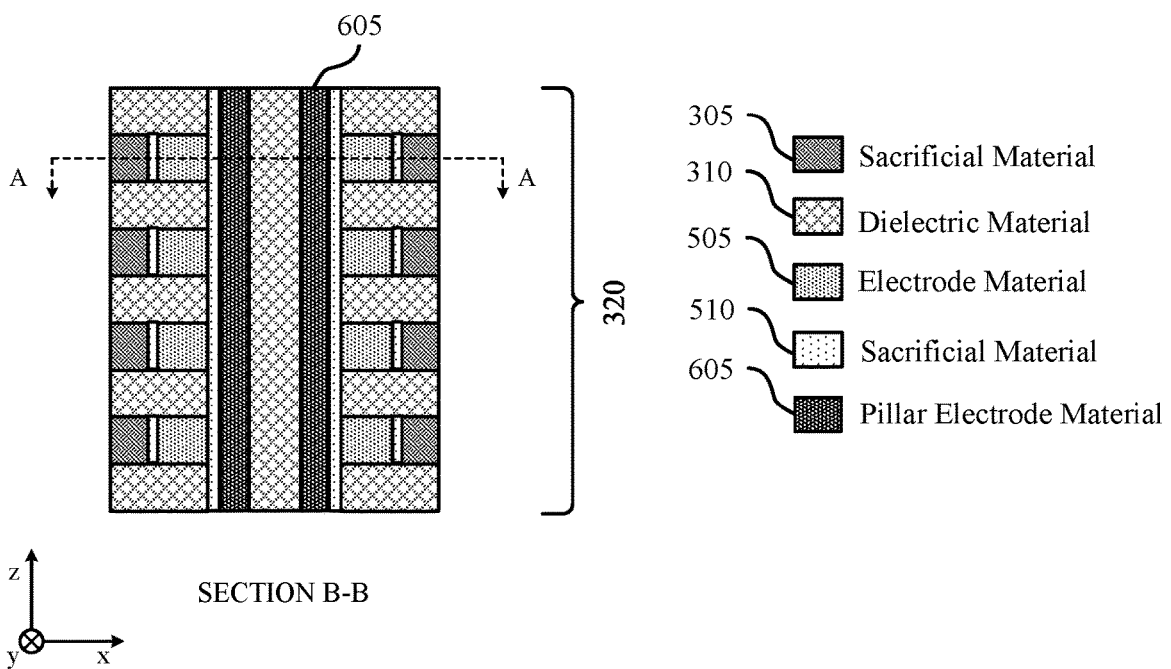

FIGS. 6A and 6B illustrate examples of memory architectures 600-*a* and 600-*b* that support a pillar word line plate architecture for a memory array in accordance with examples as disclosed herein. For example, FIGS. 6A and 6B may illustrate different views of one or more architectures used in formation of a 3D memory array, which may be an example of a 3D memory array in accordance with examples as disclosed herein, such as with reference to FIGS. 1-5B. Memory architectures 600-*a* and 600-*b* may represent a continuation of the memory architectures 500-*a* and 500-*b* described with reference to FIGS. 5A and 5B. For example, memory architectures 600-*a* and 600-*b* may represent one or more additional processing steps performed in relation to memory architectures 500-*a* and 500-*b* and may be included in a same memory device (e.g., may represent one or more fabrication steps or processes associated with the memory device). As described with reference to FIGS. 5A and 5B, memory architectures 600-*a* and 600-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 6A, where the cross sectional top view may correspond to line A-A in FIG. 6B. Similarly, the stack 320 may be shown from a cross sectional side view (e.g., in the y-direction) of section B-B in FIG. 6B, where the cross sectional side view may correspond to line B-B in FIG. 6A. Aspects of the memory architectures 600-*a* and 600-*b* may be described with reference to an x-direction, a y-direction, and a z-direction of the illustrated coordinate systems, which may correspond to the respective directions described with reference to the memory architectures 500-*a* and 500-*b*.

As described with reference to FIGS. 3A-5B, the stack (e.g., previous to the operations described with reference to FIGS. 6A and 6B) may include multiple holes (e.g., cavities openings) extending through the stack 320, where each hole may be associated with a respective pillar configured to access one or more memory cells. As illustrated by FIGS. 6A and 6B, multiple materials may be deposited within each hole to form portions of a pillar. Following the processes described with reference to FIGS. 5A and 5B, an electrode material 505 may be deposited (e.g., conformally deposited, layered) in a respective ring within each hole and next to the sacrificial material 510, up to a defined depth (e.g., forming a width of the ring). For example, the electrode material 505 may be deposited in each hole and may be etched back (e.g., selectively etched) to the defined depth via an etching process (e.g., wet etch, dry etch). In some cases, each ring of electrode material 505 may be configured to act as an interface between one or more memory cells and respective electrode (e.g., bit line) within the pillar. The electrode material 505 may be a same electrode material 505 described with reference to FIGS. 5A and 5B, or may be a different electrode material 505.

Following formation of the electrode material 505, forming the portions of the pillar may include forming (e.g., depositing) a layer of a pillar electrode material 605. For example, the pillar electrode material 605 may be deposited (e.g., conformally deposited, layered) in a respective ring within each hole and next to the electrode material 505, up to a defined depth (e.g., forming a width of the ring). In some cases, the pillar electrode material 605 may be deposited in each hole (e.g., a remaining portion of the hole) and may be etched back (e.g., selectively etched) to the defined depth via an etching process (e.g., wet etch, dry etch). In some cases, the pillar electrode material 605 may be or include a tungsten material. As described herein, the pillar electrode material 605 may support a cross-point pillar architecture, where the pillar electrode material 605 may (e.g., eventually, after one or more additional fabricating processes) include two electrodes (e.g., electrically isolated electrodes). The pillar electrodes (e.g., including pillar electrode material 605), along with the word line plates, may be used to access one or more memory cells of the memory array, as described herein.

Following formation of the pillar electrode material 605, and to support electrical isolation of the two electrodes within a pillar, forming the portions of the pillar may include forming a layer of a dielectric material 310, where the dielectric material 310 may electrically insulate the two halves (e.g., eventual halves) of the pillar electrode material 605. For example, the dielectric material 310 may be deposited (e.g., conformally deposited, layered, filled) in a respective hole and next to the pillar electrode material 605. In some cases, the dielectric material 310 may filled in each hole (e.g., a remaining portion of the hole). In some cases, the dielectric material 310 may be or include a same dielectric material as included in the stack 320 of alternating materials, or may be or include a different dielectric material 310.

In some cases, the electrode material 505, the pillar electrode material 605, and the dielectric material 310 may be formed via a layered deposition process or a selective deposition process. For example, the electrode material 505, the pillar electrode material 605, and the dielectric material 310 may be formed via an ALD process, in which successive layers of material may be deposited on top of one another. In some cases, the electrode material 505, the pillar electrode material 605, and the dielectric material 310 may be formed via another deposition process, such as a filling process (e.g., and the electrode material 505 and the pillar electrode material 605 may subsequently be etched back). In some cases, after forming the dielectric material 310 within each of the pillars, a planarization process may be performed on the memory array, in which materials may be removed from a top of the stack 320 (e.g., in the z-direction) to align (e.g., to largely or mostly align) the materials at a same level in the z-direction.

Figure 7A:
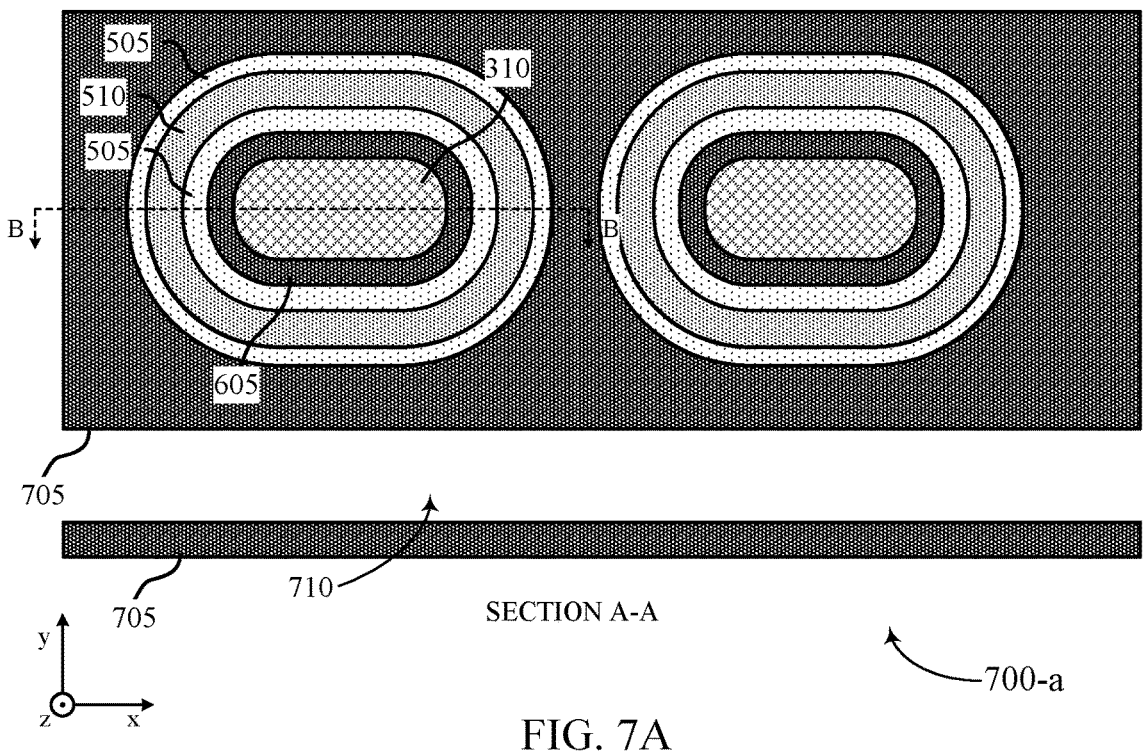
FIGS. 7A and 7B illustrate examples of memory architectures that support a pillar and word line plate architecture for a memory array in accordance with examples as disclosed herein.
Figure 7B:
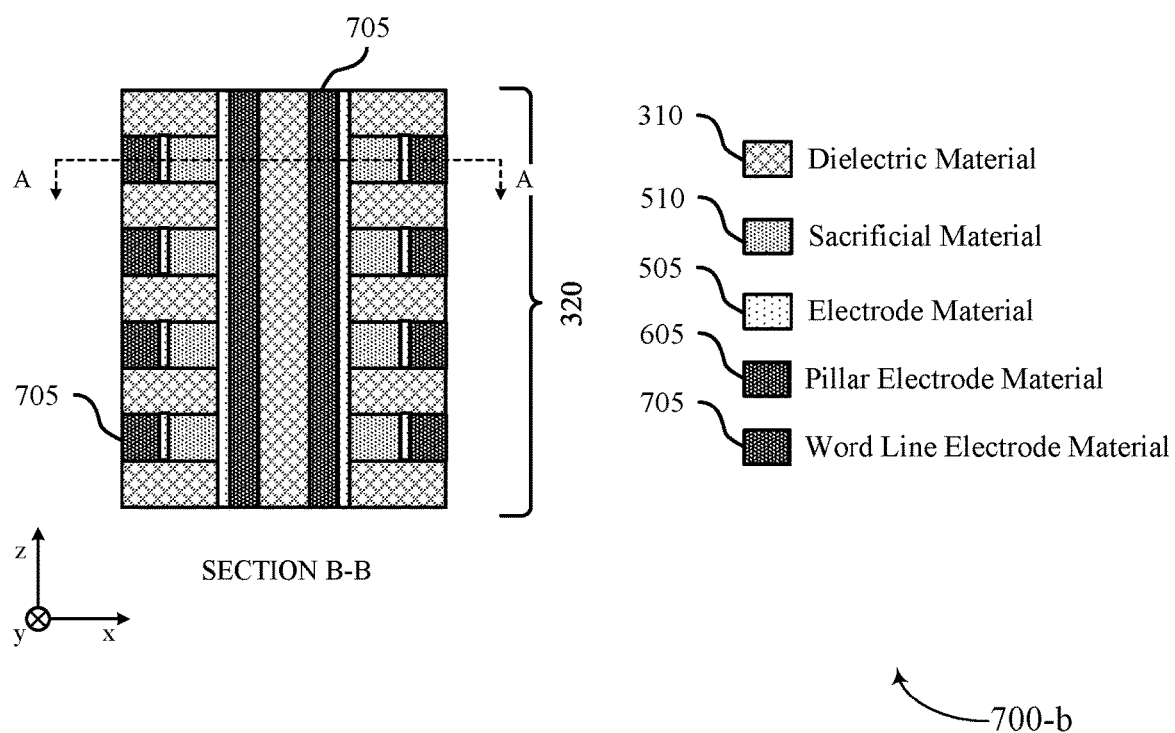

FIGS. 7A and 7B illustrate examples of memory architectures 700-*a* and 700-*b* that support a pillar and word line plate architecture for a memory array in accordance with examples as disclosed herein. For example, FIGS. 7A and 7B may illustrate different views of one or more architectures used in formation of a 3D memory array, which may be an example of a 3D memory array in accordance with examples as disclosed herein, such as with reference to FIGS. 1-6B. Memory architectures 700-*a* and 700-*b* may represent a continuation of the memory architectures 600-*a* and 600-*b* described with reference to FIGS. 6A and 6B. For example, memory architectures 700-*a* and 700-*b* may represent one or more additional processing steps performed in relation to memory architectures 600-*a* and 600-*b* and may be included in a same memory device (e.g., may represent one or more fabrication steps or processes associated with the memory device). As described with reference to FIGS. 6A and 6B, memory architectures 700-*a* and 700-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 7A, where the cross sectional top view may correspond to line A-A in FIG. 7B. Similarly, the stack 320 may be shown from a cross sectional side view (e.g., in the y-direction) of section B-B in FIG. 7B, where the cross sectional side view may correspond to line B-B in FIG. 7A. Aspects of the memory architectures 700-*a* and 700-*b* may be described with reference to an x-direction, a y-direction, and a z-direction of the illustrated coordinate systems, which may correspond to the respective directions described with reference to the memory architectures 600-*a* and 600-*b*.

As illustrated in FIG. 7A, multiple slits 710 (e.g., trenches) may be etched through the stack 320 (e.g., using a dry etch process) at different locations. The slits 710 may divide the memory array into different stacks of word line plates (e.g., divided into different word line plates at a respective level of the array), where a word line plate or a stack of word line plates may be referred to as a word line tile (e.g., where each word line plate may be operable to access one memory cell at a time). The division of word line plates may, in some cases, support concurrent access of memory cells from different word line plates (e.g., different word line tiles).

A slit 710 may also support removal of the sacrificial material 305 described with reference to FIGS. 3A-6B (e.g., a sacrificial material 305 associated with word line plates). For example, via the slit 710, one or more chemicals may be applied (e.g., introduced) to the stack 320 to selectively etch (e.g., wet etch, exhume) the sacrificial material at the respective layers of the stack 320. Removal of the sacrificial materials of the stack 320 may result in formation of slits (e.g., openings, recesses) at the respective layers of the stack 320, each having a relatively similar shape to the removed sacrificial material. In such cases, the pillars and pillar materials previously formed (e.g., as described with reference to FIGS. 5A-6B) may provide structural support the stack 320.

After removal of the sacrificial material 305, a word line electrode material 705 may be deposited in the openings formed by removing the sacrificial material 305. The word line electrode material 705 may be or include a same material as the pillar electrode material 605 (e.g., tungsten), or may be or include another electrode material. In some cases, the word line electrode material 705 may be deposited via a layered deposition process (e.g., via ALD) or may be deposited using another process (e.g., the openings may be otherwise filled with the word line electrode material 705).

The word line electrode material 705 may take a same or similar shape as the removed sacrificial material, such that the word line electrode material 705 may, at a respective layer of the stack 320, surround the pillars. The word line electrode material 705 may also be formed in respective spaces between layers of dielectric material 310 in the stack. Thus, the word line electrode material 705 may form word line plates, each word line plate at a respective level of the stack 320 and each word line plate coupled (e.g., electrically coupled, physically coupled) with an electrode material 505 associated with the pillar and the memory cells of the array. The word line electrode material 705 may not be filled into the slit 710, or may be removed if partially or fully occupying the slit 710, such that the slit 710 may support division of the memory array into different word line plates and associated word line tiles.

Figure 8A:
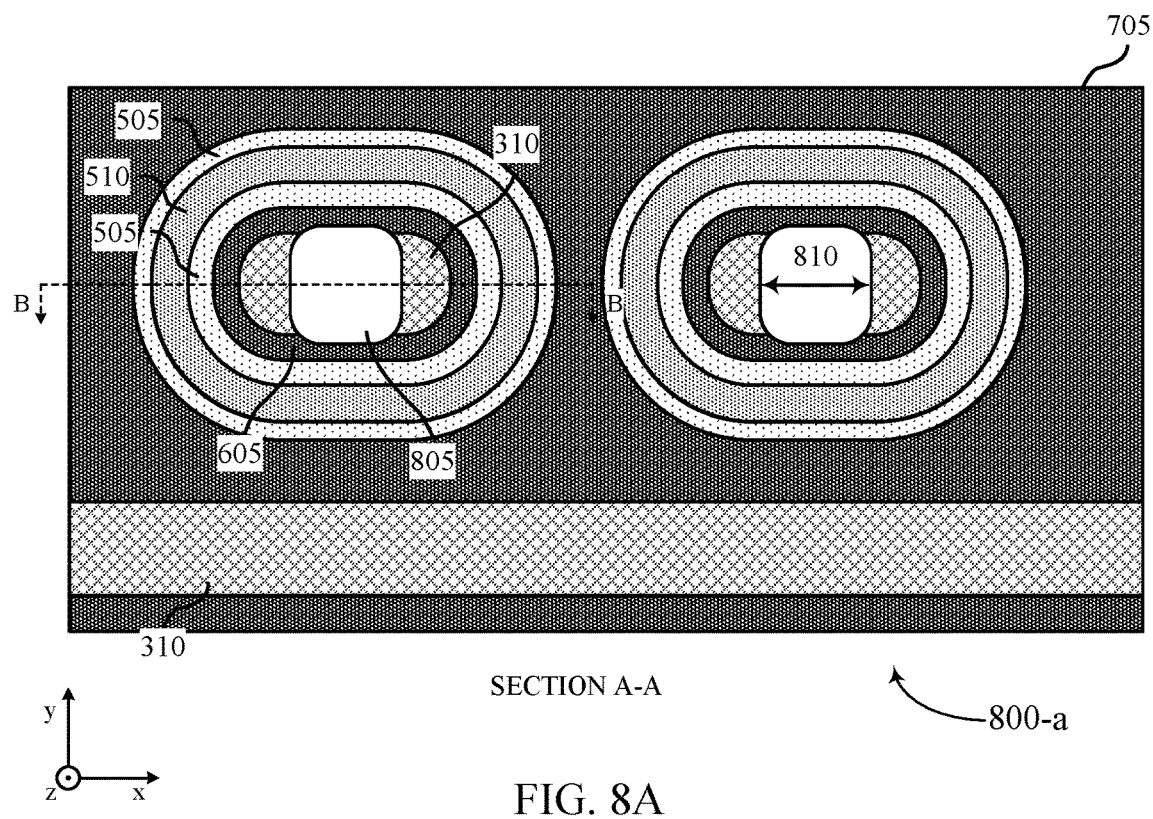
FIGS. 8A and 8B illustrate examples of memory architectures that support a pillar and word line plate architecture for a memory array in accordance with examples as disclosed herein.
Figure 8B:
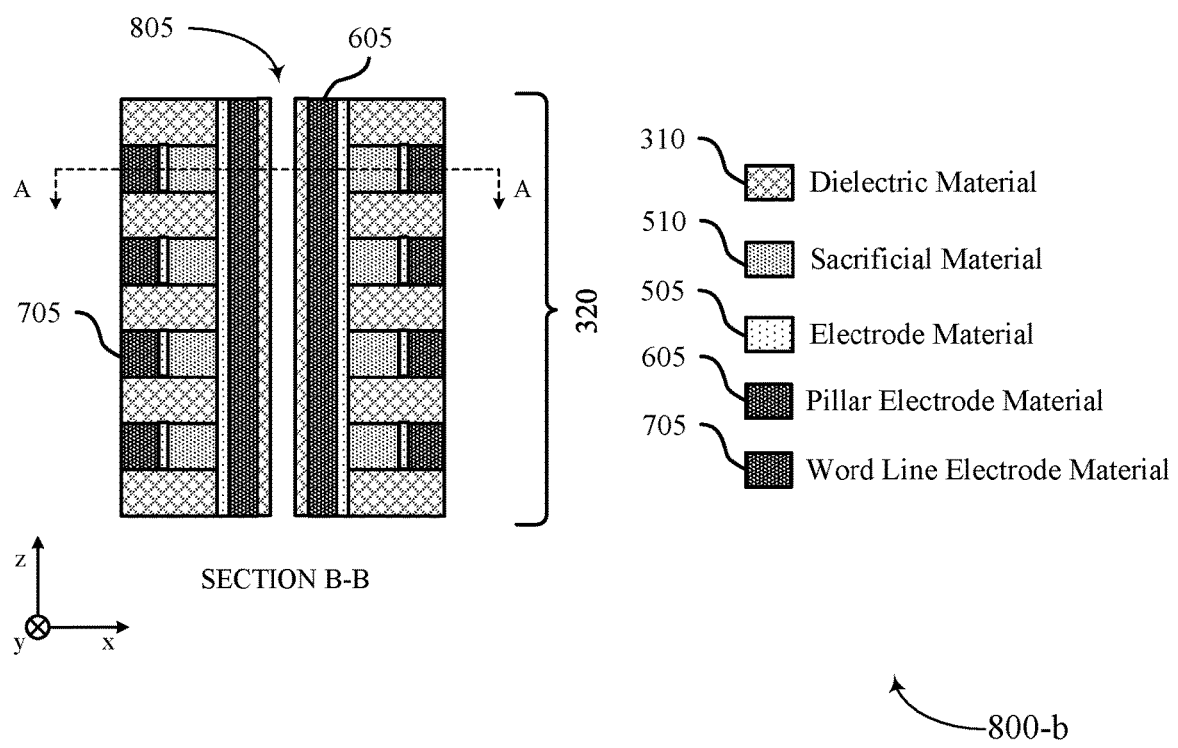

FIGS. 8A and 8B illustrate examples of memory architectures 800-*a* and 800-*b* that support a pillar and word line plate architecture for a memory array in accordance with examples as disclosed herein. For example, FIGS. 8A and 8B may illustrate different views of one or more architectures used in formation of a 3D memory array, which may be an example of a 3D memory array in accordance with examples as disclosed herein, such as with reference to FIGS. 1-7B. Memory architectures 800-*a* and 800-*b* may represent a continuation of the memory architectures 700-*a* and 700-*b* described with reference to FIGS. 7A and 7B. For example, memory architectures 800-*a* and 800-*b* may represent one or more additional processing steps performed in relation to memory architectures 700-*a* and 700-*b* and may be included in a same memory device (e.g., may represent one or more fabrication steps or processes associated with the memory device). As described with reference to FIGS. 7A and 7B, memory architectures 800-*a* and 800-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 8A, where the cross sectional top view may correspond to line A-A in FIG. 8B. Similarly, the stack 320 may be shown from a cross sectional side view (e.g., in the y-direction) of section B-B in FIG. 8B, where the cross sectional side view may correspond to line B-B in FIG. 8A. Aspects of the memory architectures 800-*a* and 800-*b* may be described with reference to an x-direction, a y-direction, and a z-direction of the illustrated coordinate systems, which may correspond to the respective directions described with reference to the memory architectures 700-*a* and 700-*b*.

As described with reference to FIGS. 7A and 7B, a slit 710 may have previously been etched through the stack 320. The slit may be filled with a dielectric material 310, which may represent a same dielectric material 310 included at respective layers of the stack 320, or may represent a different dielectric material 310. The dielectric material 310 may electrically insulate the different word line plates (e.g., of the word line electrode material 705) formed by etching the slit (e.g., as described with reference to FIGS. 7A and 7B).

Additionally, a hole 805 may be etched in the dielectric material 310 to remove a first portion of the dielectric material 310 at a center of the pillar (e.g., a portion at a center of the dielectric material 310), where a second portion of the dielectric material 310 of the pillar may remain after the etch (e.g., a second portion on both sides of the hole 805). The hole 805 may have a width 810 (e.g., a dimension), which width 810 may be configured as described with reference to FIGS. 11A and 11B. The hole 805 may, for example, be etched via one or more dry etch processes (e.g., using a mask). The etch may be configured to remove the dielectric material 310 such that the hole 805 reaches the pillar electrode material 605 in both the positive and negative y-direction. The hole 805 may, for example, be used to divide the pillar electrode material 605 into two portions, which may support a divided pillar having two electrodes as described herein. The division of the pillar electrode material 605 is further described herein with reference to at least FIGS. 9A and 9B.

Figure 9A:
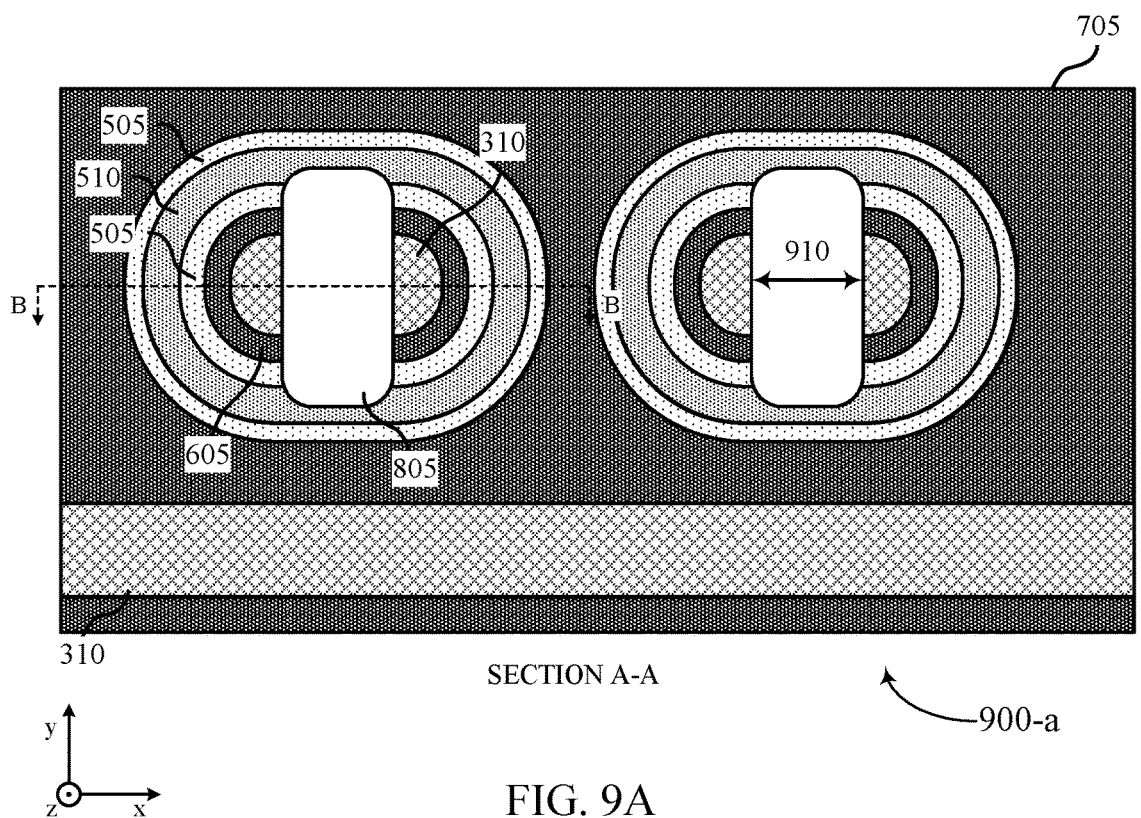
FIGS. 9A and 9B illustrate examples of memory architectures that support a pillar and word line plate architecture for a memory array in accordance with examples as disclosed herein.
Figure 9B:
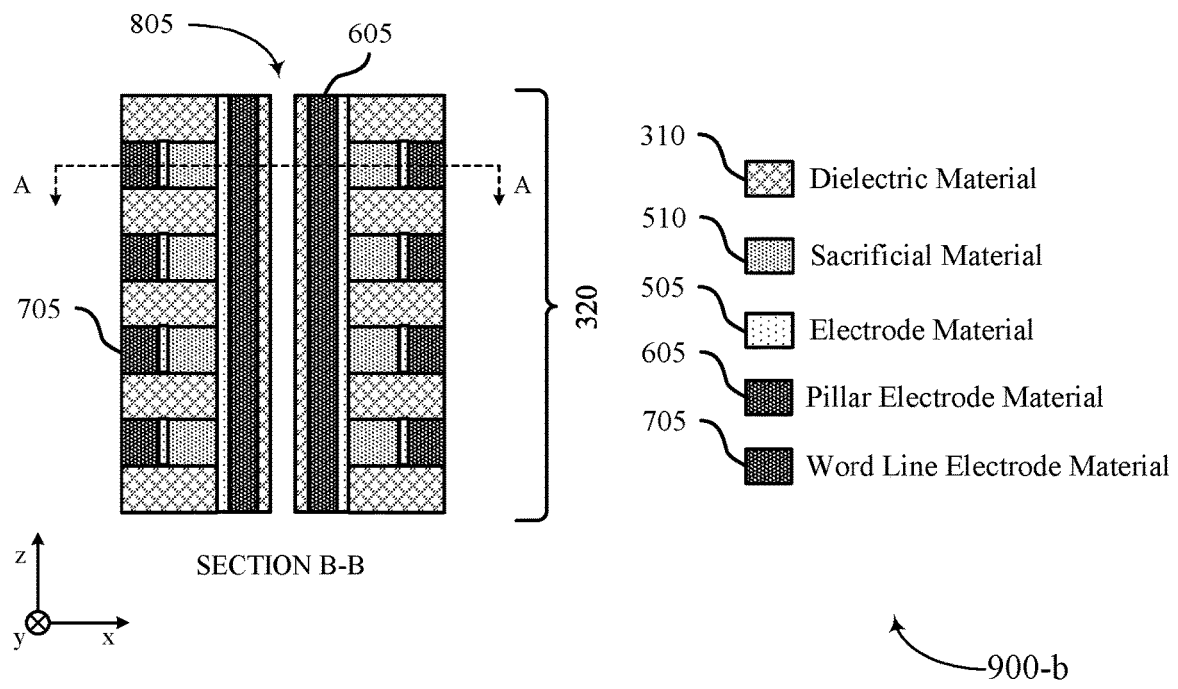

FIGS. 9A and 9B illustrate examples of memory architectures 900-*a* and 900-*b* that support a pillar and word line plate architecture for a memory array in accordance with examples as disclosed herein. For example, FIGS. 9A and 9B may illustrate different views of one or more architectures used in formation of a 3D memory array, which may be an example of a 3D memory array in accordance with examples as disclosed herein, such as with reference to FIGS. 1-8B. Memory architectures 900-*a* and 900-*b* may represent a continuation of the memory architectures 800-*a* and 800-*b* described with reference to FIGS. 8A and 8B. For example, memory architectures 900-*a* and 900-*b* may represent one or more additional processing steps performed in relation to memory architectures 800-*a* and 800-*b* and may be included in a same memory device (e.g., may represent one or more fabrication steps or processes associated with the memory device). As described with reference to FIGS. 8A and 8B, memory architectures 900-*a* and 900-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 9A, where the cross sectional top view may correspond to line A-A in FIG. 9B. Similarly, the stack 320 may be shown from a cross sectional side view (e.g., in the y-direction) of section B-B in FIG. 9B, where the cross sectional side view may correspond to line B-B in FIG. 9A. Aspects of the memory architectures 900-*a* and 900-*b* may be described with reference to an x-direction, a y-direction, and a z-direction of the illustrated coordinate systems, which may correspond to the respective directions described with reference to the memory architectures 800-*a* and 800-*b*.

As shown in FIGS. 9A and 9B, the hole 805 described with reference to FIGS. 8A and 8B may be enlarged (e.g., further etched), for example, to extend through the pillar electrode material 605 and the electrode material 505 (e.g., inner ring of electrode material 505) in the y-direction. The hole 805 may be etched to reach the sacrificial material 510 (e.g., expose at least a portion of the sacrificial material 510). In some cases, the hole 805 may also be etched into at least a portion of the sacrificial material 510. The hole 805 may be enlarged via a directional etch, which may be an example of a wet etch that etches in the y-direction (e.g., and avoids removing more materials in other directions). The enlarged hole 805 may have a width 910 (e.g., a dimension), which width 910 may be configured as described with reference to FIGS. 11A and 11B.

Enlarging the hole 805 may divide the pillar electrode material 605 into two portions (e.g., cut the pillar electrode material 605 in half) to create two electrodes (e.g., bit lines) within the pillar (e.g., formed from the pillar electrode material 605). Such a configuration may support the divided electrode configuration for the pillars described herein. The hole 805 may also provide an opening to reach the sacrificial material 510, such that the sacrificial material 510 may be removed and one or more other materials (e.g., memory cell materials) may be deposited in a resulting cavity.

Figure 10A:
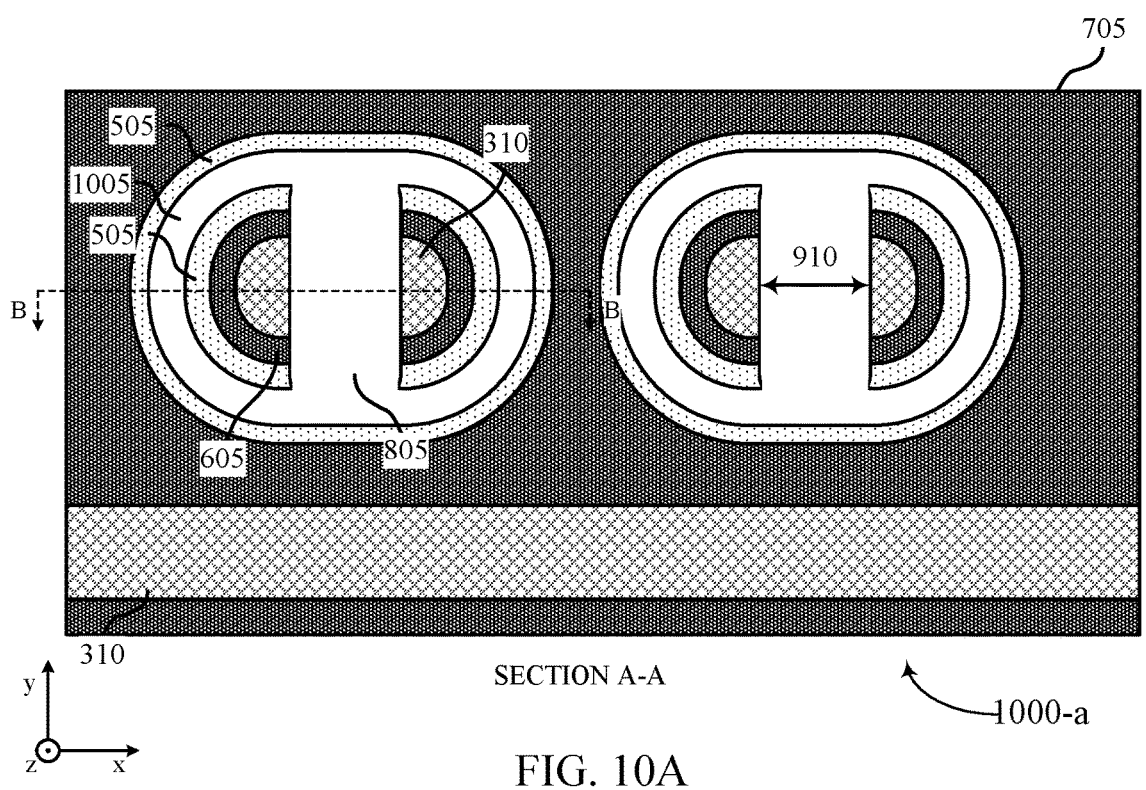
FIGS. 10A and 10B illustrate examples of memory architectures that support a pillar and word line plate architecture for a memory array in accordance with examples as disclosed herein.
Figure 10B:
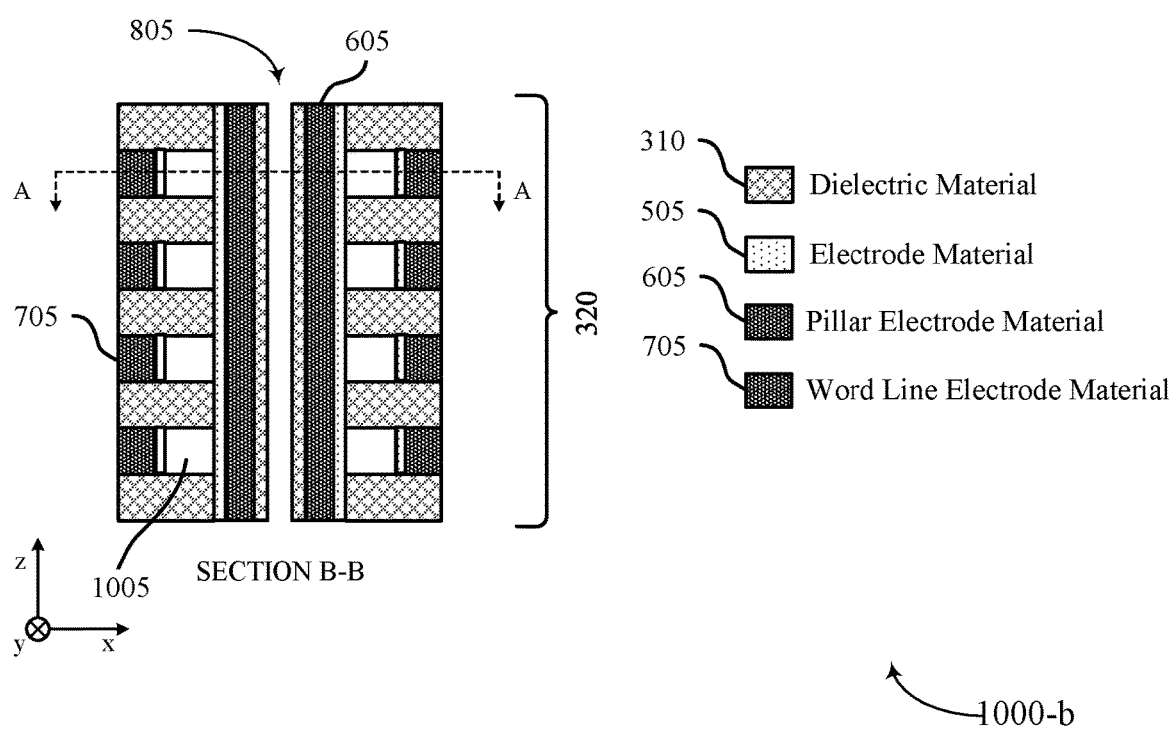

FIGS. 10A and 10B illustrate examples of memory architectures 1000-*a* and 1000-*b* that support a pillar and word line plate architecture for a memory array in accordance with examples as disclosed herein. For example, FIGS. 10A and 10B may illustrate different views of one or more architectures used in formation of a 3D memory array, which may be an example of a 3D memory array in accordance with examples as disclosed herein, such as with reference to FIGS. 1-9B. Memory architectures 1000-*a* and 1000-*b* may represent a continuation of the memory architectures 900-*a* and 900-*b* described with reference to FIGS. 9A and 9B. For example, memory architectures 1000-*a* and 1000-*b* may represent one or more additional processing steps performed in relation to memory architectures 900-*a* and 900-*b* and may be included in a same memory device (e.g., may represent one or more fabrication steps or processes associated with the memory device). As described with reference to FIGS. 9A and 9B, memory architectures 1000-*a* and 1000-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 10A, where the cross sectional top view may correspond to line A-A in FIG. 10B. Similarly, the stack 320 may be shown from a cross sectional side view (e.g., in the y-direction) of section B-B in FIG. 10B, where the cross sectional side view may correspond to line B-B in FIG. 10A. Aspects of the memory architectures 1000-*a* and 1000-*b* may be described with reference to an x-direction, a y-direction, and a z-direction of the illustrated coordinate systems, which may correspond to the respective directions described with reference to the memory architectures 900-*a* and 900-*b*.

As described with reference to FIGS. 8A-9B, a hole 805 may be formed through the stack 320 and enlarged to cut through the pillar electrode material 605 and to reach a sacrificial material 510 that acts as a placeholder for one or more memory cell materials. As shown in FIGS. 10A and 10B, the sacrificial material may be removed (e.g., exhumed) via the hole, such as via one or more wet etch processes configured to selectively etch the sacrificial material (e.g., using one or more chemicals). In some cases, removing the sacrificial material may include performing one or more poly exhume techniques. Removing the sacrificial material may result in formation of a respective cavity at a corresponding layer of the stack (e.g., a layer that previously included the sacrificial material). The cavities 1005 may be connected with the hole 805, and may each surround the hole and the pillar materials (e.g., in a ring) at the respective layer of the stack 320.

Figure 11A:
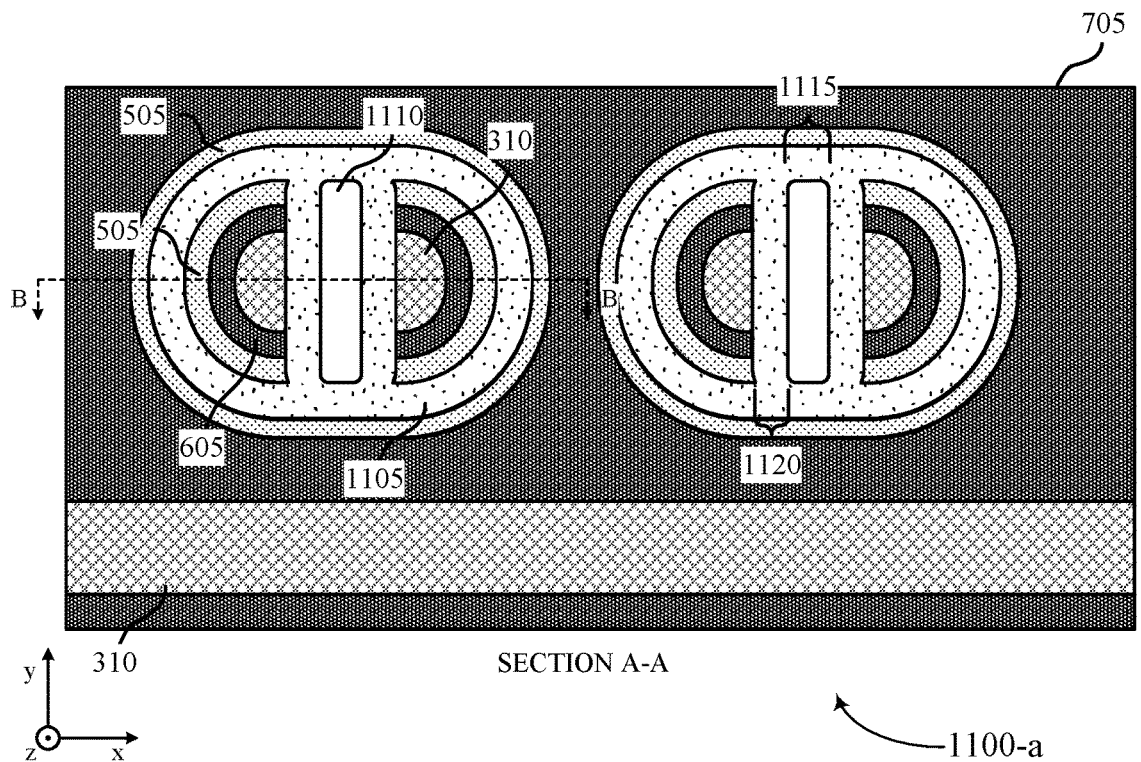
FIGS. 11A and 11B illustrate examples of memory architectures that support a pillar and word line plate architecture for a memory array in accordance with examples as disclosed herein.
Figure 11B:
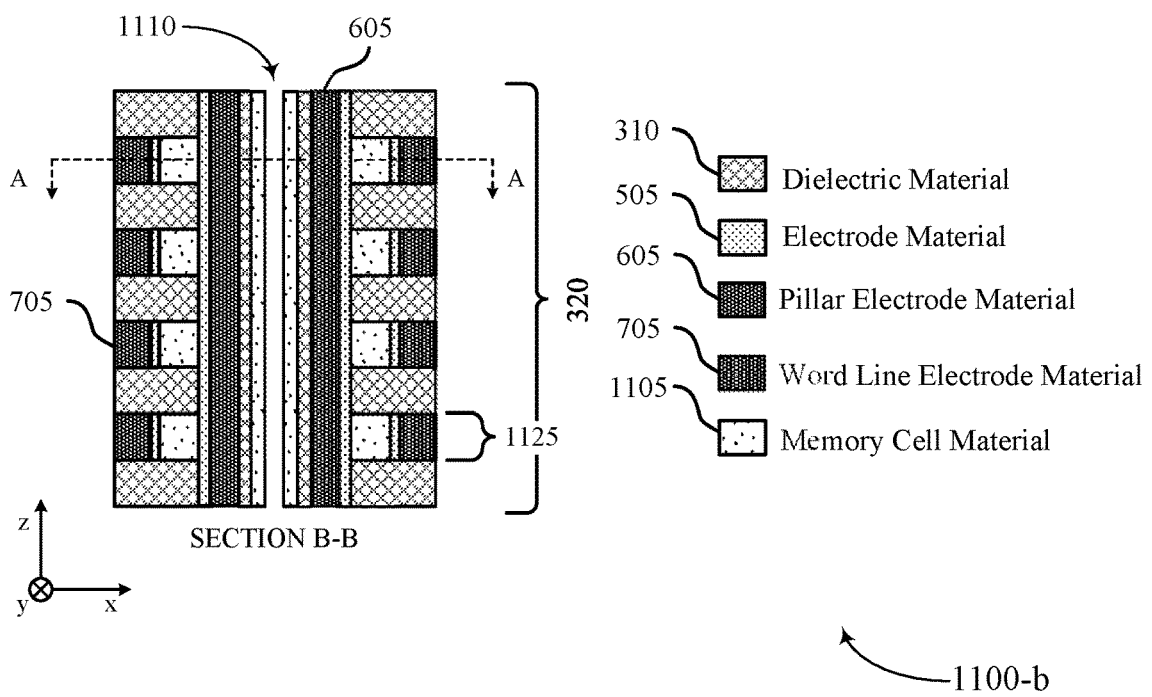

FIGS. 11A and 11B illustrate examples of memory architectures 1100-*a* and 1100-*b* that support a pillar and word line plate architecture for a memory array in accordance with examples as disclosed herein. For example, FIGS. 11A and 11B may illustrate different views of one or more architectures used in formation of a 3D memory array, which may be an example of a 3D memory array in accordance with examples as disclosed herein, such as with reference to FIGS. 1-10B. Memory architectures 1100-*a* and 1100-*b* may represent a continuation of the memory architectures 1000-*a* and 1000-*b* described with reference to FIGS. 10A and 10B. For example, memory architectures 1100-*a* and 1100-*b* may represent one or more additional processing steps performed in relation to memory architectures 1000-*a* and 1000-*b* and may be included in a same memory device (e.g., may represent one or more fabrication steps or processes associated with the memory device). As described with reference to FIGS. 10A and 10B, memory architectures 1100-*a* and 1100-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 11A, where the cross sectional top view may correspond to line A-A in FIG. 11B. Similarly, the stack 320 may be shown from a cross sectional side view (e.g., in the y-direction) of section B-B in FIG. 11B, where the cross sectional side view may correspond to line B-B in FIG. 11A. Aspects of the memory architectures 1100-*a* and 1100-*b* may be described with reference to an x-direction, a y-direction, and a z-direction of the illustrated coordinate systems, which may correspond to the respective directions described with reference to the memory architectures 1000-*a* and 1000-*b*.

As described with reference to FIGS. 8A-10B, a hole 805 and cavities 1005 may be formed in the stack 320, where the hole 805 may extend through the stack 320 and the cavities 1005 may be connected with the hole 805, and may each be located at a respective layer of the stack 320. A memory material 1105 may be formed within the hole and the cavities (e.g., using ALD or another deposition technique), and may, for example, be conformally deposited on walls of the hole and cavities. In some cases, the memory material 1105 may be a chalcogenide material, but the memory material 1105 may additionally or alternatively be another material. The deposition of the memory material, in some examples, may fill the cavities (e.g., forming a respective ring of memory material 1105 at each layer of the stack 320) but may leave a smaller hole 1110 at the center (e.g., relative center) of the previous hole. The hole 1110 may extend through the stack and may have a width 1115 (e.g., a dimension).

The hole 1110 may function as an opening to support further etching (e.g., wet etching), via a center of the pillar, for example, as described with reference to FIGS. 12A and 12B. For example, an etchant (e.g., one or more chemicals) may be applied via the hole 1110 and may flow down the hole in the z-direction and out from the hole in the x-direction (e.g., at a layer of the stack 320 including memory material 1105). The etching rate of material throughout the pillar may be configured to be uniform on either side of the pillar in the x-direction and in the z-direction, for example, based on the width 1115 of the hole 1110 (e.g., to support penetration of the etchant down the pillar). The width 1115 may therefore be sized in order to support etching operations. The hole 1110 may be surrounded by memory material 1105, which may have a width 1120, where the width 1120 may be half of a height 1125 of the memory material 1105 within the stack 320. For example, the width 1120 may be half of the height 1125 because the memory material 1105 may be deposited on the top and bottom walls of the cavities within the stack 320 and may be deposited up to the width 1120 from both the top wall and bottom wall, such that the total height of the filled cavity may be twice the width 1120.

As described with reference to FIGS. 8A-9B, a width 810 or 910, or both, may be sized based on the width 1115 (e.g., a desired width for further etching) and the width 1120 (e.g., a width based on memory cell dimensions). For example, the width 810 or 910, or both, may sized to be greater than or equal to the width 1115 plus two times the width 1120 (e.g., where width 1120 is half of the height 1125).

Figure 12A:
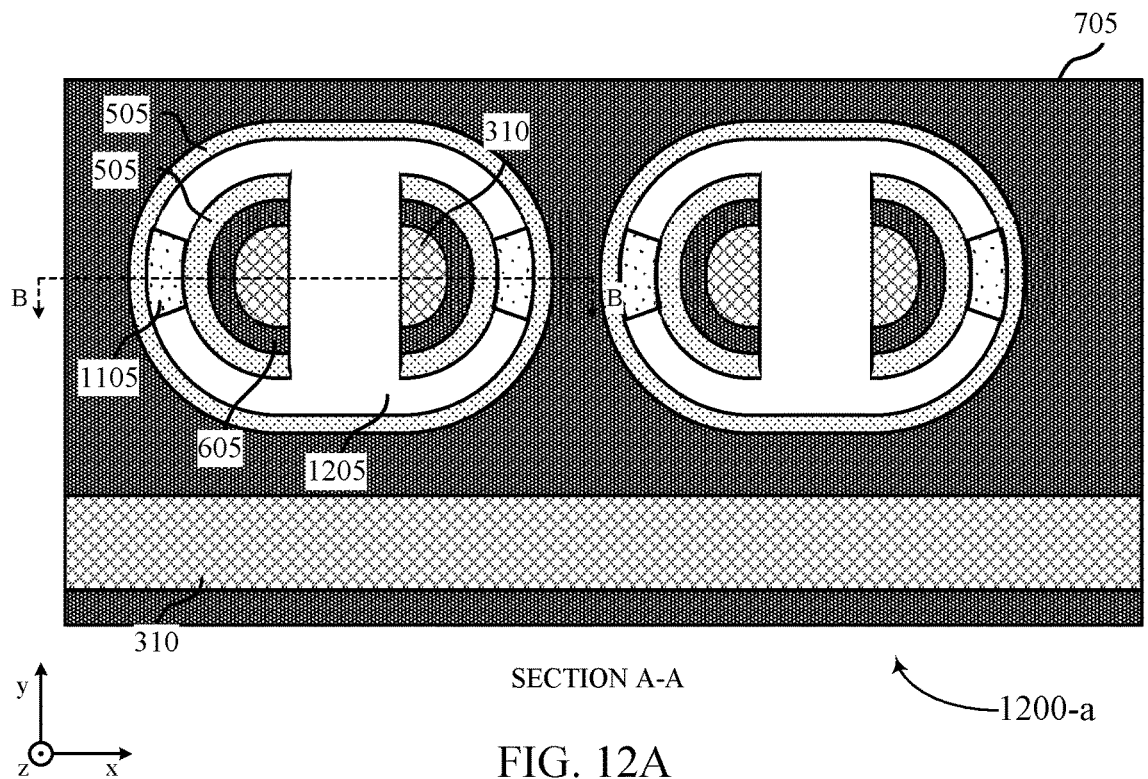
FIGS. 12A and 12B illustrate examples of memory architectures that support a pillar and word line plate architecture for a memory array in accordance with examples as disclosed herein.
Figure 12B:
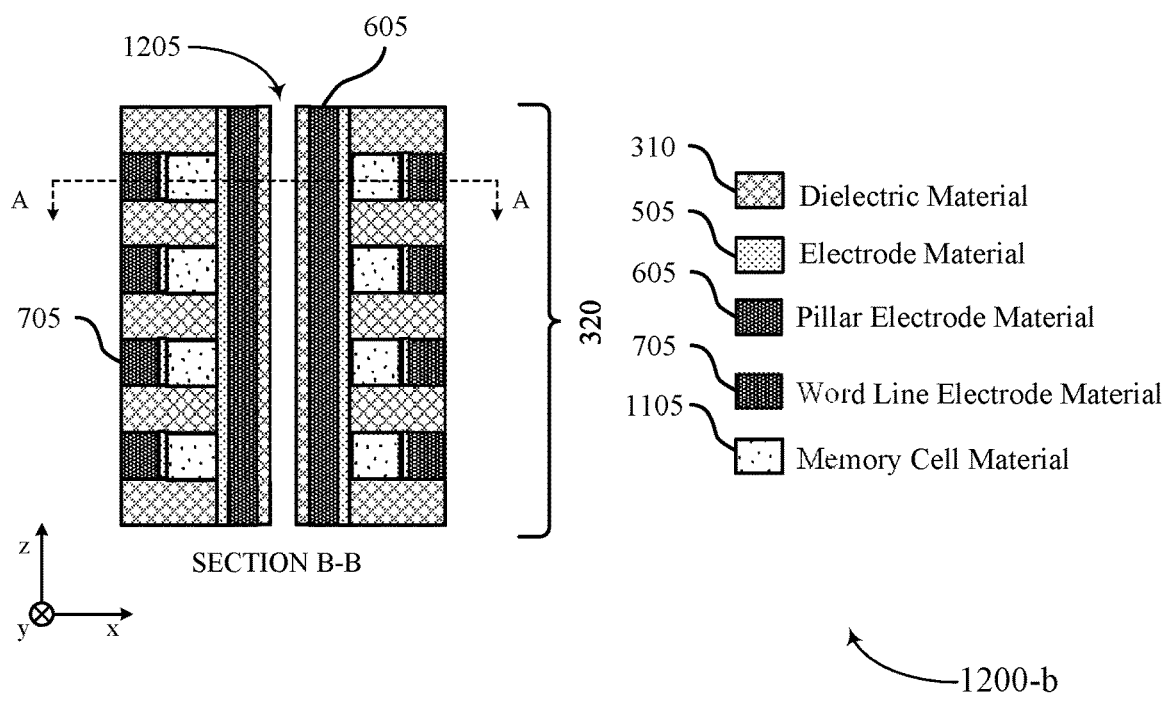

FIGS. 12A and 12B illustrate examples of memory architectures 1200-a and 1200-b that support a pillar and word line plate architecture for a memory array in accordance with examples as disclosed herein. For example, FIGS. 12A and 12B may illustrate different views of one or more architectures used in formation of a 3D memory array, which may be an example of a 3D memory array in accordance with examples as disclosed herein, such as with reference to FIGS. 1-11B. Memory architectures 1200-a and 1200-b may represent a continuation of the memory architectures 1100-a and 1100-b described with reference to FIGS. 11A and 11B. For example, memory architectures 1200-a and 1200-b may represent one or more additional processing steps performed in relation to memory architectures 1100-a and 1100-b and may be included in a same memory device (e.g., may represent one or more fabrication steps or processes associated with the memory device). As described with reference to FIGS. 11A and 11B, memory architectures 1200-a and 1200-b may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 12A, where the cross sectional top view may correspond to line A-A in FIG. 12B. Similarly, the stack 320 may be shown from a cross sectional side view (e.g., in the y-direction) of section B-B in FIG. 12B, where the cross sectional side view may correspond to line B-B in FIG. 12A. Aspects of the memory architectures 1200-a and 1200-b may be described with reference to an x-direction, a y-direction, and a z-direction of the illustrated coordinate systems, which may correspond to the respective directions described with reference to the memory architectures 1100-a and 1100-b.

As described with reference to FIGS. 10A and 10B, memory material 1105 may be deposited in the cavities and holes formed in the memory array. Following the deposition, the memory material 1105 may be etched back (e.g., using a wet etch, a selective etch) to form memory material elements (e.g., memory cells) of the memory array. For example, as described with reference to FIGS. 11A and 11B, a wet etch may be applied via the hole 1110 in the center of the pillar to form the hole 1205 and to further etch the memory material 1105 at the respective layers of the stack 320. The etching process may be configured to remove memory material 1105 (e.g., based on etching time, a type of etchant) such that the memory material elements may have a defined dimension in the y-direction (e.g., each element may be within a range).

A lower bound of a size of the memory material elements in the y-direction may be 10 nanometers (nm), or another defined dimension. Below the lower bound, the memory material elements may experience reduced or impaired functionality (e.g., may be unable to write or store a logic state) and the lower bound may be defined based on a size at which such reduced or impaired functionality is experienced. Similarly, an upper bound of a size of the memory material elements in the y-direction may be 20 nm or another defined dimension. Above the upper bound, the memory material elements may be associated with a larger current for reading and writing a logic state, which may consume relatively large amounts of power. The upper bound may be defined based on a size at which such increased power consumption is experienced.

Figure 13A:
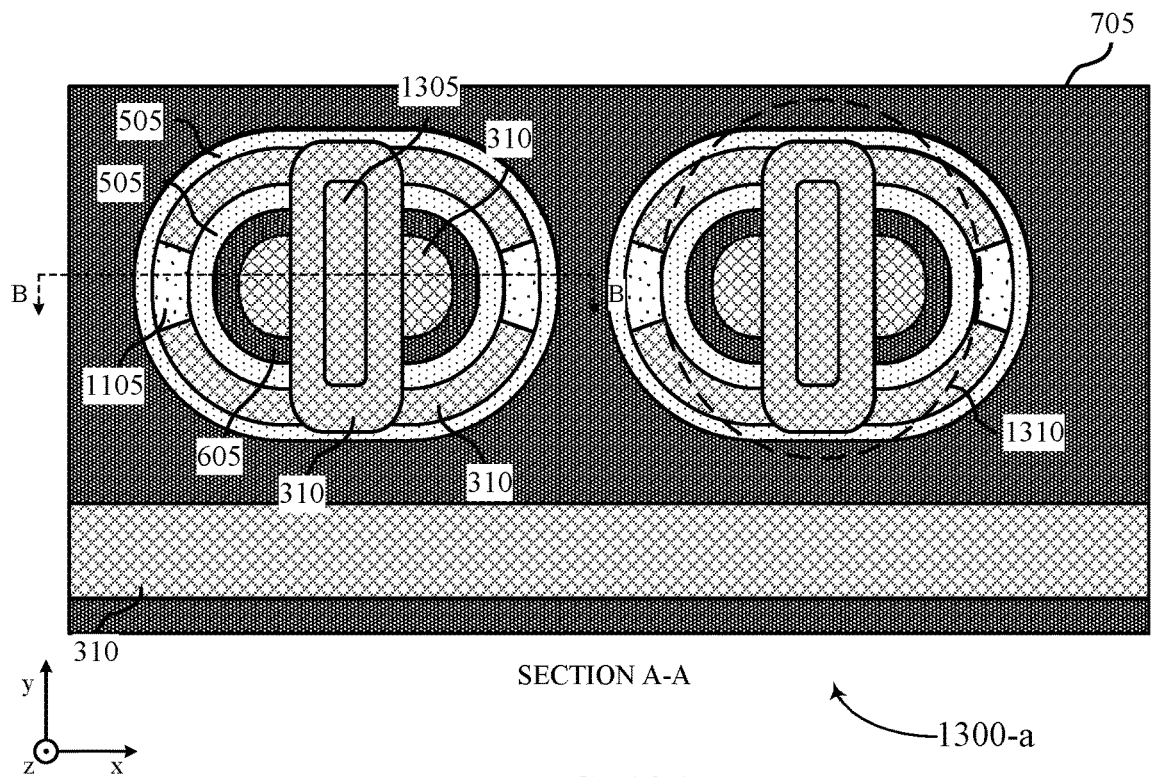
FIGS. 13A and 13B illustrate examples of memory architectures that support a pillar and word line plate architecture for a memory array in accordance with examples as disclosed herein.
Figure 13B:
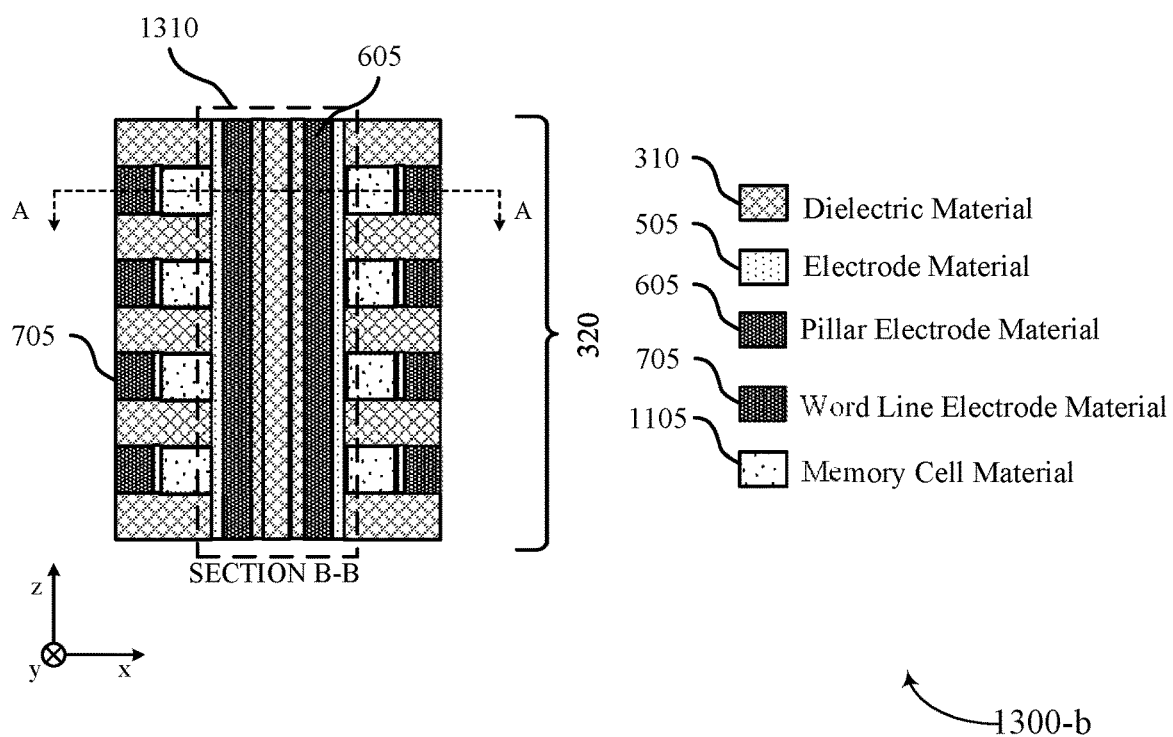

FIGS. 13A and 13B illustrate examples of memory architectures 1300-a and 1300-b that support a pillar and word line plate architecture for a memory array in accordance with examples as disclosed herein. For example, FIGS. 13A and 13B may illustrate different views of one or more architectures used in formation of a 3D memory array, which may be an example of a 3D memory array in accordance with examples as disclosed herein, such as with reference to FIGS. 1-12B. Memory architectures 1300-a and 1300-b may represent a continuation of the memory architectures 1200-a and 1200-b described with reference to FIGS. 12A and 12B. For example, memory architectures 1300-a and 1300-b may represent one or more additional processing steps performed in relation to memory architectures 1200-a and 1200-b and may be included in a same memory device (e.g., may represent one or more fabrication steps or processes associated with the memory device). As described with reference to FIGS. 12A and 12B, memory architectures 1300-a and 1300-b may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 13A, where the cross sectional top view may correspond to line A-A in FIG. 13B. Similarly, the stack 320 may be shown from a cross sectional side view (e.g., in the y-direction) of section B-B in FIG. 13B, where the cross sectional side view may correspond to line B-B in FIG. 13A. Aspects of the memory architectures 1300-a and 1300-b may be described with reference to an x-direction, a y-direction, and a z-direction of the illustrated coordinate systems, which may correspond to the respective directions described with reference to the memory architectures 1200-a and 1200-b.

As described with reference to FIGS. 12A and 12B, memory material 1105 may be formed into memory material elements that may be used as memory cells, with a hole 1205 between memory material elements and between two halves of a pillar 1310 (e.g., between the pillar electrode materials 605 and other associated materials). In order to provide electrical isolation between memory material elements and between the pillar electrodes, the hole may be filled with one or more dielectric materials 310. For example, the dielectric material(s) 310 may be conformally deposited (e.g., using ALD or another technique) or may be filled into the hole. In some cases, the hole may be filled with one type of dielectric material 310 (e.g., a nitride material). In some other cases, the hole may be filled with a first dielectric material 310 (e.g., a nitride material), except for a subset 1305 that may be filled with a second dielectric material 310 (e.g., an oxide material). In such cases, the first dielectric material may be conformally deposited within the hole to fill the space between memory material elements and to surround a center portion of the hole (e.g., in a ring). After forming the first dielectric material, the second dielectric material may be deposited (e.g., conformally deposited, filled) into the remaining portion of the hole.

The dielectric material(s) 310 may be same materials or different materials than previously used dielectric materials 310 within the memory array. In some cases, a dielectric material 310 may be a same material used as the sacrificial material (e.g., a nitride material) for word line plate formation (e.g., sacrificial material 305, used as a placeholder for forming the word line plates). In some cases, using an oxide material between the electrodes of the pillar 1310 (e.g., using oxide material by itself, using oxide material with another dielectric material 310) may influence a parasitic capacitance between the pillar electrodes (e.g., may capacitively couple or decouple the electrodes). In some examples, the subset 1305 may remain unfilled to reduce the parasitic capacitance between the pillar electrodes.

Figure 14:
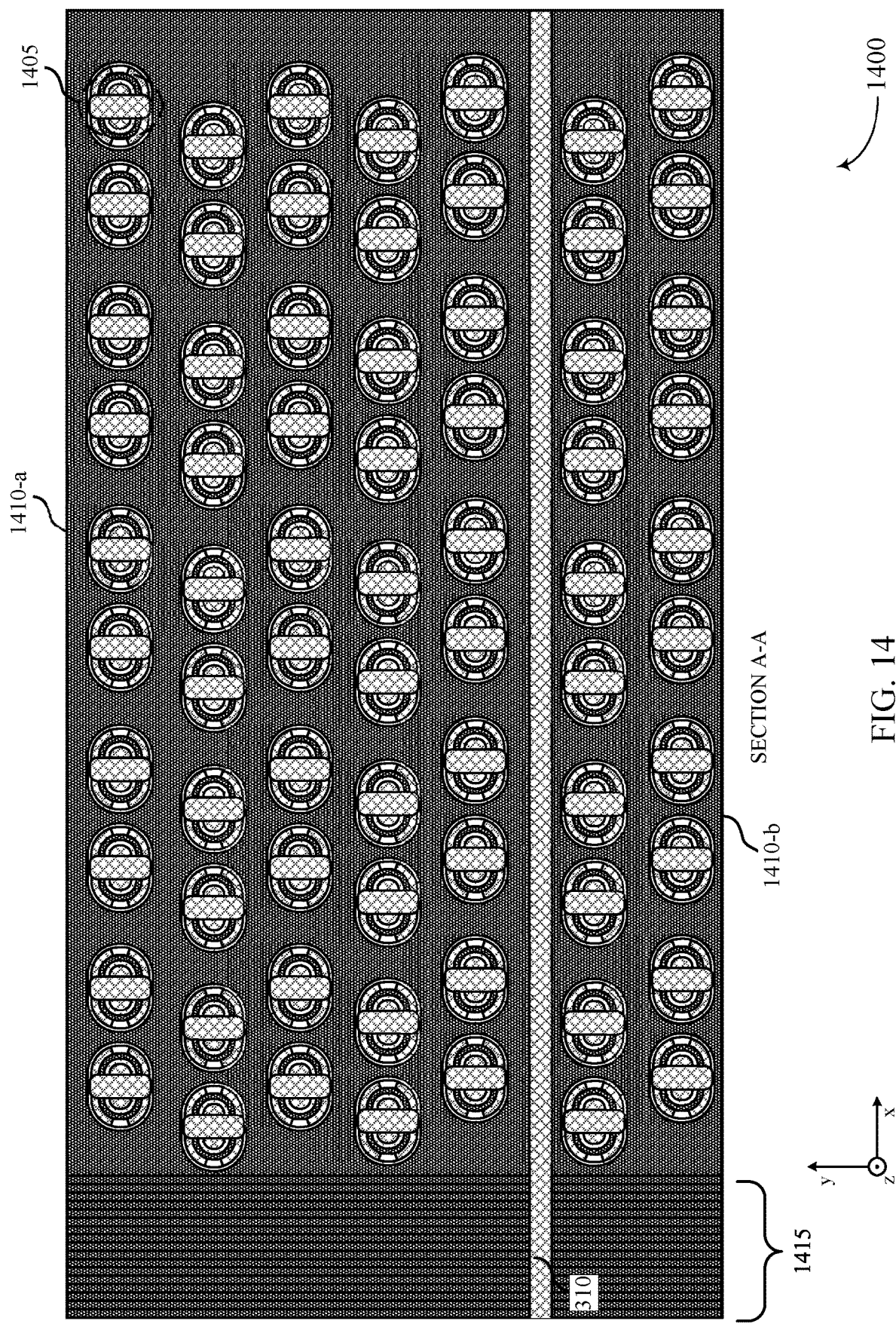
FIG. 14 illustrates an example of a memory array that supports a pillar and word line plate architecture for a memory array in accordance with examples as disclosed herein.

FIG. 14 illustrates an example of a memory array 1400 that supports a pillar and word line plate architecture for a memory array in accordance with examples as disclosed herein. Memory array 1400 may be an example of memory array formed using the techniques described with reference to FIGS. 3A-13B. Memory array 1400 may thus be referred to, in some examples, as a 3D memory array. Memory array 1400 may include a stack of word line plates 1410 alternating with insulating material (e.g., dielectric material 310). Memory array 1400 may also include multiple pillars 1405, which may each be formed using the techniques described with reference to FIGS. 3A-13B. Memory array 1400 may represent an example of the memory architectures 1300-a and 1300-b.

The memory array 1400 may be illustrated in a cross sectional top view (e.g., in the z-direction) of section A-A, where the cross sectional top view may correspond to line A-A in FIG. 13B. Aspects of the memory array 1400 may be described with reference to an x-direction, a y-direction, and a z-direction of the illustrated coordinate system, which may correspond to the respective directions described with reference to the memory architectures 1300-a and 1300-b.

In some cases, a dielectric material 310 (e.g., as described with reference to FIGS. 8A and 8B) may separate and electrically insulate word line plate 1410-a and 1410-b (e.g., and other word line plates 1410 in the respective stacks) to support separation of word line plates 1410 into word line tiles as described herein. The memory array 1400 may include further structures not shown herein. For example, additional word line plates 1410 (e.g., stack of word line plates 1410) and pillars 1405, or portions thereof, may be included in the memory array 1400, extending in any-direction from the shown portion of the memory array 1400. As described with reference to FIGS. 3A and 3B, the stacks of word line plates 1410 may form the staircase 1415, which may be a unidirectional staircase 1415 (e.g., associated with one stack of word line plates 1410) or may be a bidirectional staircase 1415 (e.g., associated with two stacks of word line plates 1410 on both sides of the staircase 1415 in the x-direction). In some examples, the staircase, may include or be coupled with a respective electrode (e.g., electrical contacts) for each level of word line plates 1410.

The pillars 1405 may have a structure similar to that described with reference to FIGS. 5A-13B, and may be formed concurrently (e.g., at least partially concurrently) or sequentially, or any combination of both. For example, each pillar 1405 may include an outer ring of electrode material that couples with (e.g., physically or electrically couples with) the word line plates 1410 in a stack. The outer ring of electrode material may also couple with one or more respective memory cells (e.g., memory material elements), and electrically insulating material between the memory cells, at each layer of the word line plates 1410. The one or more respective memory cells and the electrically insulating material may further couple with two different half-rings of electrode material and pillar electrode material (e.g., one memory cell coupled with a respective electrode material). One or more insulating (e.g., dielectric) materials may be positioned between the pillar electrode materials, which may insulate the pillar electrode materials from each other.

In some aspects, the memory array 1400 as described herein may support access operations performed on one or more memory cells. For example, a first voltage may be applied to one of the word line plates 1410 (e.g., via the staircase 1415), and a second voltage may be applied to one of the pillar electrodes (e.g., made of pillar electrode material) within a pillar associated with the word line plate 1410. A memory cell at an intersection of that word line plate and the pillar electrode may be accessed for a read or write operation based on the applied first voltage and second voltage. As described herein, the first voltage may be applied via the staircase 1415, and the second voltage may be applied via a selector device above or below the corresponding pillar electrode. When one pillar electrode has a voltage applied, the other electrode of the same pillar 1405 may not have a voltage applied (e.g., such that one cell may be selected at a time, per pillar 1405). In some cases, one pillar electrode associated with the word line plate 1410 may have a voltage applied, while the other pillar electrodes associated with the word line plate 1410 may not have a voltage applied (e.g., such that one cell may be selected at a time, per word line plate 1410).

Figure 15A:
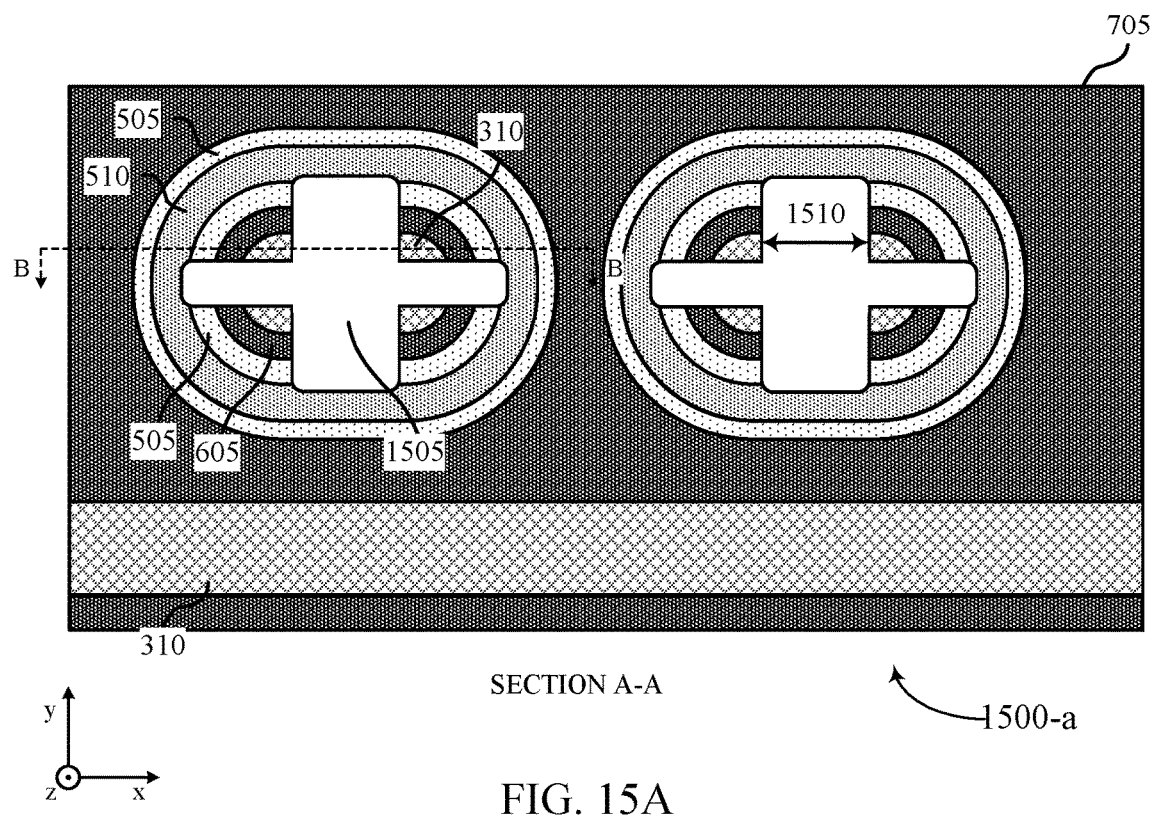
FIGS. 15A and 15B illustrate examples of memory architectures that support a pillar and word line plate architecture for a memory array in accordance with examples as disclosed herein.
Figure 15B:
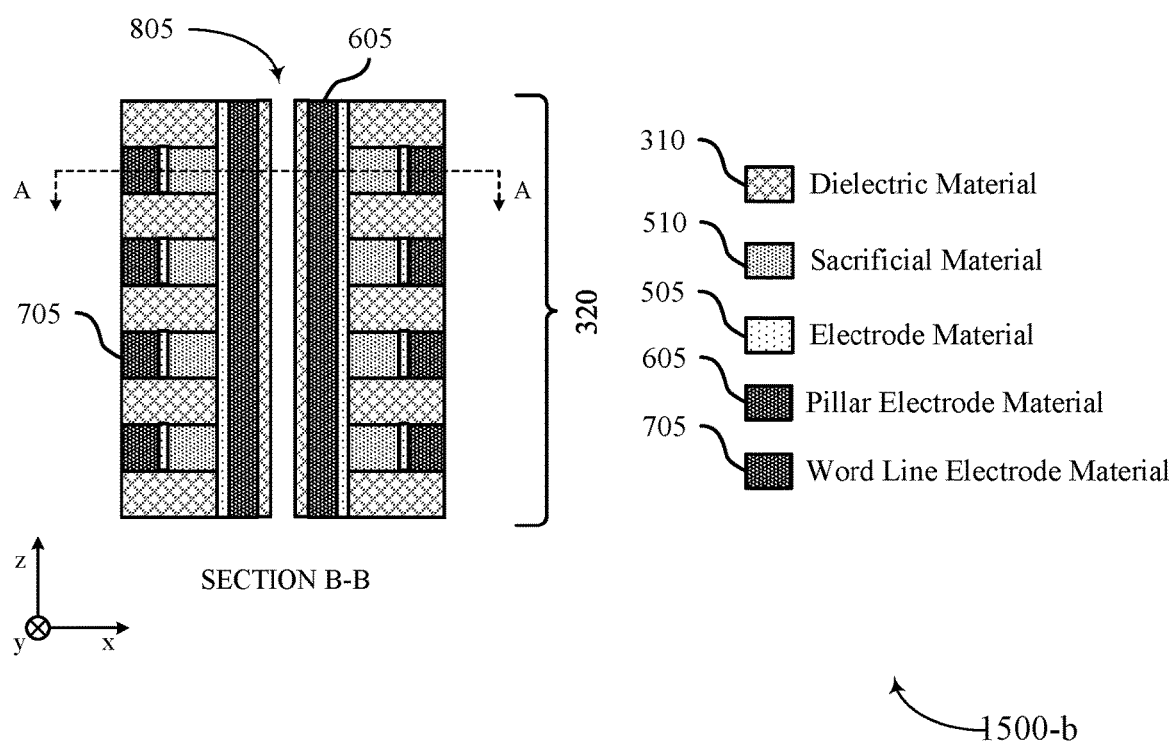

FIGS. 15A and 15B illustrate examples of memory architectures 1500-a and 1500-b that support a pillar and word line plate architecture for a memory array in accordance with examples as disclosed herein. For example, FIGS. 15A and 15B may illustrate different views of one or more architectures used in formation of a 3D memory array, which may be an example of a 3D memory array in accordance with examples as disclosed herein, such as with reference to FIGS. 1-7B. Memory architectures 1500-a and 1500-b may represent a continuation of the memory architectures 700-a and 700-b described with reference to FIGS. 7A and 7B, and may represent additional or alternative techniques with respect to those described with reference to FIGS. 8A-9B.

For example, memory architectures 1500-a and 1500-b may represent one or more additional processing steps performed in relation to memory architectures 700-a and 700-b and may be included in a same memory device (e.g., may represent one or more fabrication steps or processes associated with the memory device). As described with reference to FIGS. 7A and 7B, memory architectures 1500-a and 1500-b may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 15A, where the cross sectional top view may correspond to line A-A in FIG. 15B. Similarly, the stack 320 may be shown from a cross sectional side view (e.g., in the y-direction) of section B-B in FIG. 15B, where the cross sectional side view may correspond to line B-B in FIG. 15A. Aspects of the memory architectures 1500-*a* and 1500-*b* may be described with reference to an x-direction, a y-direction, and a z-direction of the illustrated coordinate systems, which may correspond to the respective directions described with reference to the memory architectures 700-*a* and 700-*b*.

As shown in FIGS. 15A and 15B, a hole 1505 may be formed through the stack 320, which may be similar to the hole 805 described with reference to FIGS. 8A-9B. For example, a first, smaller hole may be formed in the dielectric material 310 at the center of the pillar. In the examples shown in FIGS. 15A and 15B, the first hole may be etched in a first direction (e.g., y-direction) and a second direction (e.g., x-direction), through the dielectric material 310. The first hole may be enlarged (e.g., further etched), for example, to extend through the pillar electrode material 605 and the electrode material 505 (e.g., inner ring of electrode material 505) in the y-direction and the x-direction. The hole 1505 may be etched to reach the sacrificial material 510 (e.g., expose at least a portion of the sacrificial material 510). In some cases, the hole 1505 may also be etched into at least a portion of the sacrificial material 510. The hole 1505 may be enlarged via a directional etch, which may be an example of a wet etch that etches in the y-direction and in the x-direction (e.g., and avoids removing more materials in other directions). The enlarged hole 1505 may have a width 1510 (e.g., a dimension), which width 1510 may be configured as described with reference to FIGS. 11A and 11B. In some cases, a width of the hole 1505 in the y-direction (e.g., a width of a horizontal portion of the hole 1505) may additionally or alternatively be configured as described with reference to FIGS. 11A and 11B.

Enlarging the hole 1505 may divide the pillar electrode material 605 into four portions (e.g., cut the pillar electrode material 605 in fourths) to create four electrodes (e.g., bit lines) within the pillar (e.g., formed from the pillar electrode material 605). Such a configuration may support the divided electrode configuration for the pillars described herein. The hole 1505 may also provide an opening to reach the sacrificial material 510, such that the sacrificial material 510 may be removed and one or more other materials (e.g., memory cell materials) may be deposited in a resulting cavity.

Figure 16A:
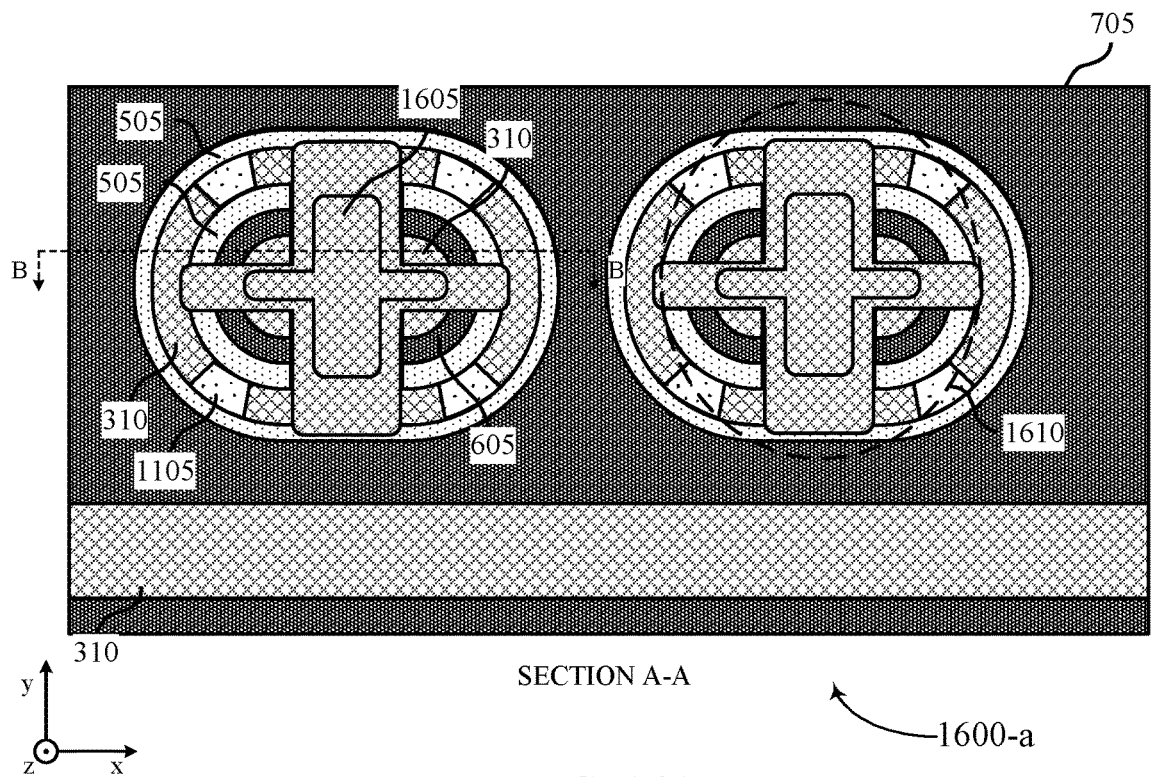
FIGS. 16A and 16B illustrate examples of memory architectures that support a pillar and word line plate architecture for a memory array in accordance with examples as disclosed herein.
Figure 16B:
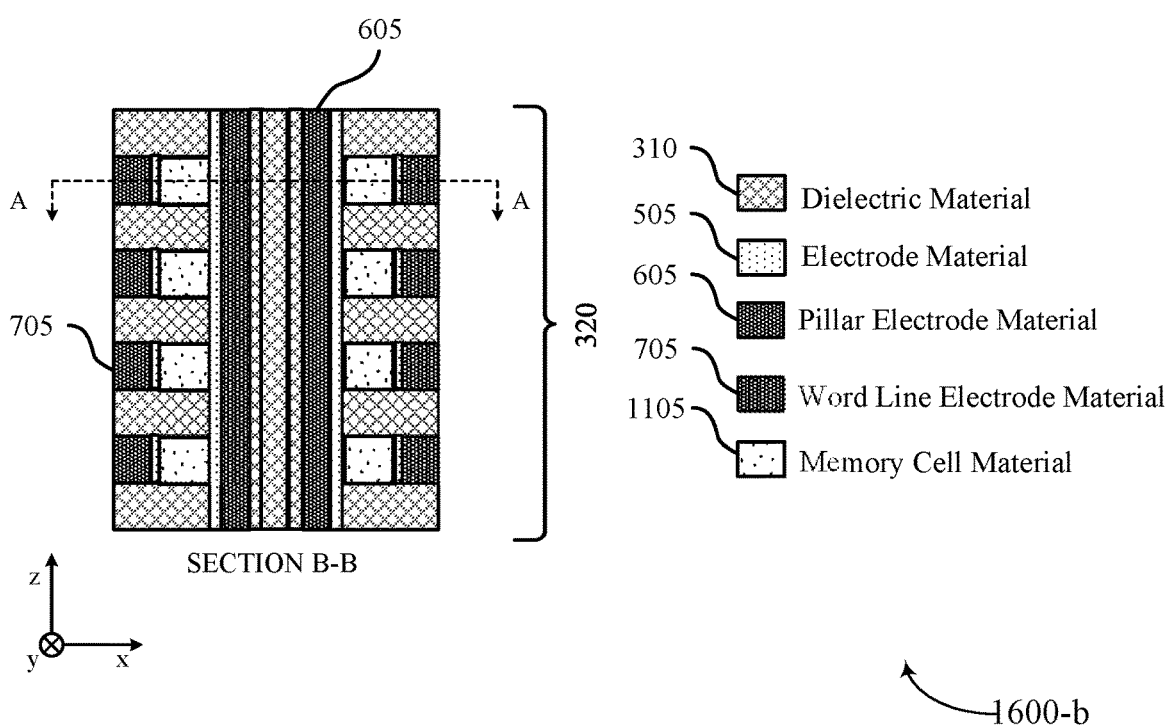

FIGS. 16A and 16B illustrate examples of memory architectures 1600-*a* and 1600-*b* that support a pillar and word line plate architecture for a memory array in accordance with examples as disclosed herein. For example, FIGS. 16A and 16B may illustrate different views of one or more architectures used in formation of a 3D memory array, which may be an example of a 3D memory array in accordance with examples as disclosed herein, such as with reference to FIGS. 1-7B, 15A, and 15B. Memory architectures 1600-*a* and 1600-*b* may represent a continuation of the memory architectures 1500-*a* and 1500-*b* described with reference to FIGS. 15A and 15B. For example, memory architectures 1600-*a* and 1600-*b* may represent one or more additional processing steps performed in relation to memory architectures 1500-*a* and 1500-*b* and may be included in a same memory device (e.g., may represent one or more fabrication steps or processes associated with the memory device). As described with reference to FIGS. 15A and 15B, memory architectures 1600-*a* and 1600-*b* may include multiple materials stacked in a vertical direction (e.g., z-direction), relative to a substrate, which may form a stack 320 (e.g., a stack of materials).

The stack 320 may be illustrated in a cross sectional top view (e.g., in the z-direction) of section A-A in FIG. 16A, where the cross sectional top view may correspond to line A-A in FIG. 16B. Similarly, the stack 320 may be shown from a cross sectional side view (e.g., in the y-direction) of section B-B in FIG. 16B, where the cross sectional side view may correspond to line B-B in FIG. 16A. Aspects of the memory architectures 1600-*a* and 1600-*b* may be described with reference to an x-direction, a y-direction, and a z-direction of the illustrated coordinate systems, which may correspond to the respective directions described with reference to the memory architectures 1500-*a* and 1500-*b*.

As described with reference to FIGS. 15A and 15B, a hole 1505 may be formed through the stack 320 and enlarged to cut through the pillar electrode material 605 and to reach a sacrificial material 510 that acts as a placeholder for one or more memory cell materials. After forming the hole, and similar to the processes described with reference to FIGS. 10A and 10B, the sacrificial material may be removed (e.g., exhumed) via the hole, such as using one or more wet etch processes configured to selectively etch the sacrificial material (e.g., using one or more chemicals). The removal of the sacrificial material may form a respective cavity at a corresponding layer of the stack 320 (e.g., in place of the sacrificial material), where the hole may extend through the stack and the cavities may be connected with the hole.

After forming the cavities, and similar to the processes described with reference to FIGS. 11A and 11B, memory material 1105 may be formed within the hole and the cavities (e.g., using ALD or another deposition technique), and may, for example, be conformally deposited on walls of the hole and cavities. As described with reference to FIGS. 11A and 11B, the deposition of the memory material 1105, in some examples, may fill the cavities (e.g., forming a respective ring of memory material 1105 at each layer of the stack 320) but may leave a smaller, cross-shaped hole at the center (e.g., relative center) of the previous hole, where the larger hole and the resulting smaller hole may be dimensioned similar to the techniques described with respect to FIGS. 11A and 11B.

Following the deposition of the memory material 1105, and similar to the techniques described with reference to FIGS. 12A and 12B, the memory material 1105 may be etched back (e.g., using a wet etch, a selective etch) to form memory material elements (e.g., memory cells) of the memory array. For example, as described with reference to FIGS. 11A-12B, a wet etch may be applied via the hole in the center of the pillar to further etch the memory material 1105 at the respective layers of the stack 320. The etching process may be configured to remove portions of the memory material 1105 (e.g., based on etching time, a type of etchant) such that the memory material elements may have a defined dimension in the y-direction (e.g., each element may be within a range, similar to a range described with reference to FIGS. 12A and 12B). In the example illustrated by FIGS. 16A and 16B, because the hole has a cross shape and an etchant may be applied via all of the arms of the hole, the memory material elements may be at different locations than those illustrated in FIGS. 12A-14 (e.g., may be located at the "corners" of the pillar), and there may be four memory material elements created by the etch, with each memory material element corresponding to a portion of the pillar electrode material 605 (e.g., physically, electrically coupled with the pillar electrode material 605).

A hole may be located at the center of the pillar and between memory material elements. In order to provide electrical isolation between memory material elements and between the pillar electrodes, the hole may be filled with one or more dielectric materials 310, similar to the techniques described with reference to FIGS. 13A and 13B. For example, the dielectric material(s) 310 may be conformally deposited (e.g., using ALD or another technique) or may be filled into the hole. In some cases, the hole may be filled with one type of dielectric material 310 (e.g., a nitride material). In some other cases, the hole may be filled with a first dielectric material 310 (e.g., a nitride material), except for a subset 1605 that may be filled with a second dielectric material 310 (e.g., an oxide material). In such cases, the first dielectric material may be conformally deposited within the hole to fill the space between memory material elements and to surround a center portion of the hole (e.g., in a ring). After forming the first dielectric material, the second dielectric material may be deposited (e.g., conformally deposited, filled) into the remaining portion of the hole.

The dielectric material(s) 310 may be same materials or different materials than previously used dielectric materials 310 within the memory array. In some cases, a dielectric material 310 may be a same material used as the sacrificial material (e.g., a nitride material) for word line plate formation (e.g., sacrificial material 305, used as a placeholder for forming the word line plates). In some cases, using an oxide material between the electrodes of the pillar 1610 (e.g., using oxide material by itself, using oxide material with another dielectric material 310) may influence a parasitic capacitance between the pillar electrodes (e.g., may capacitively couple or decouple the electrodes). In some examples, the subset 1605 may remain unfilled to reduce the parasitic capacitance between the pillar electrodes.

Similar to the memory array 1400 described with reference to FIG. 14, a memory array may include multiple pillars 1610 and related structures, as well as multiple word line plates and multiple stacks of word line plates. Each portion of pillar electrode material 605 may be associated with a respective selector device for applying a voltage to the pillar electrode material 605 (e.g., to access a memory cell), which may result in four selector devices per pillar 1610. Similarly, each word line plate may be associated with a contact at a respective level of a word line staircase (e.g., as described with reference to FIG. 14), via which a voltage may be applied to the word line staircase.

In some aspects, the memory array may support access operations performed on one or more memory cells. For example, a first voltage may be applied to one of the word line plates (e.g., via the staircase), and a second voltage may be applied to one of the pillar electrodes (e.g., made of pillar electrode material 605) within a pillar 1610 associated with the word line plate. A memory cell at an intersection of that word line plate and the pillar electrode may be accessed for a read or write operation based on the applied first voltage and second voltage. As described herein, the first voltage may be applied via the staircase, and the second voltage may be applied via a selector device above or below the corresponding pillar electrode. When one pillar electrode has a voltage applied, the other electrodes of the same pillar 1610 may not have a voltage applied (e.g., such that one cell may be selected at a time, per pillar 1610). In some cases, one pillar electrode associated with a word line plate may have a voltage applied, while the other pillar electrodes associated with the word line plate may not have a voltage applied (e.g., such that one cell may be selected at a time, per word line plate).

Figure 17:
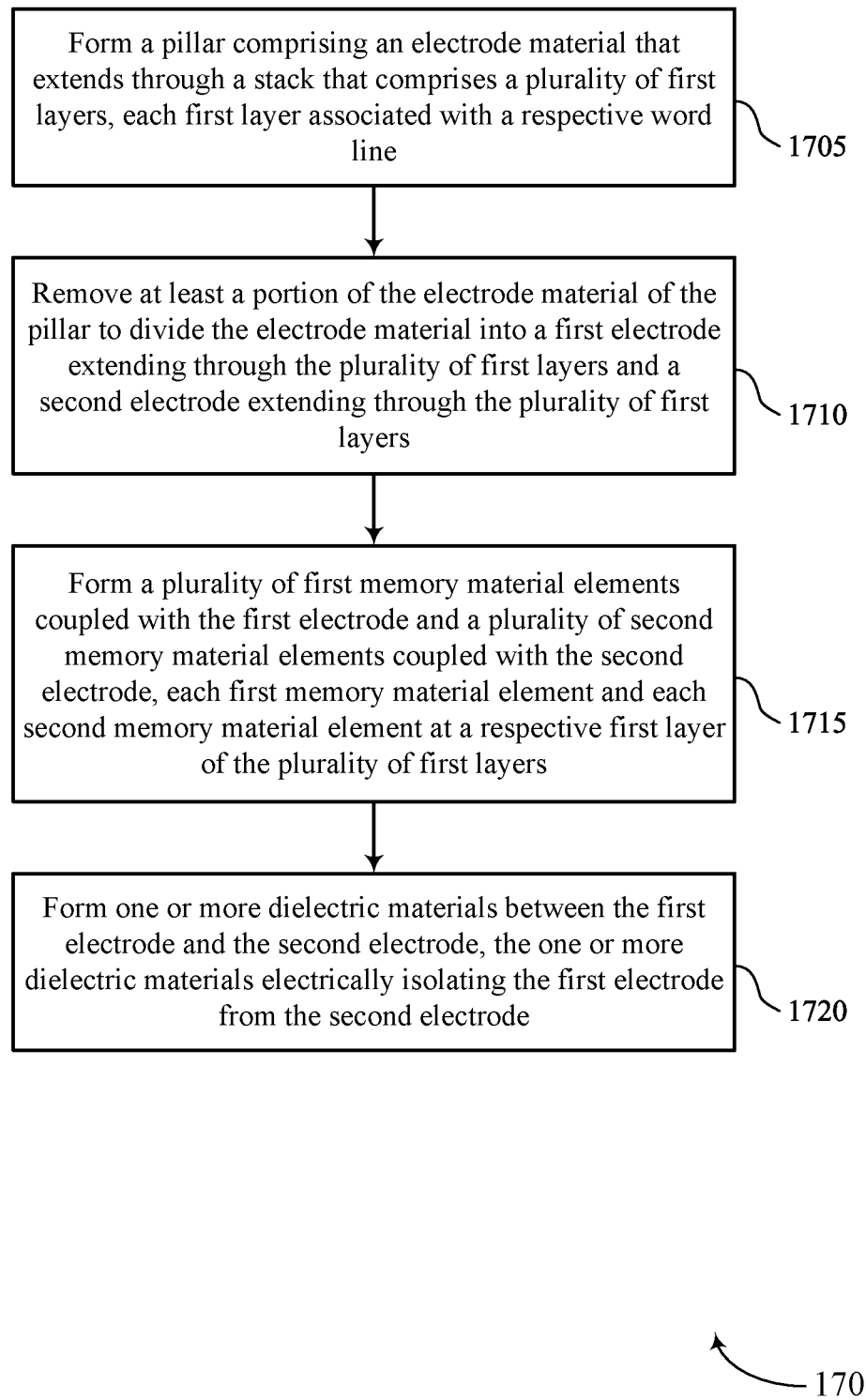
FIGS. 17 and 18 show flowcharts illustrating a method or methods that support a pillar and word line plate architecture for a memory array in accordance with examples as disclosed herein.

FIG. 17 shows a flowchart illustrating a method 1700 that supports a pillar and word line plate architecture for a memory array in accordance with examples as disclosed herein. The operations of method 1700 may be implemented by a manufacturing system or its components as described herein. For example, the operations of method 1700 may be performed by a manufacturing system as described with reference to FIGS. 1 through 16. In some examples, a manufacturing system may execute a set of instructions to control the functional elements of the device to perform the described functions. Additionally, or alternatively, the manufacturing system may perform aspects of the described functions using special-purpose hardware.

At 1705, the method may include forming a pillar including an electrode material that extends through a stack that includes a plurality of first layers, each first layer associated with a respective word line. The operations of 1705 may be performed in accordance with examples as disclosed herein.

At 1710, the method may include removing at least a portion of the electrode material of the pillar to divide the electrode material into a first electrode extending through the plurality of first layers and a second electrode extending through the plurality of first layers. The operations of 1710 may be performed in accordance with examples as disclosed herein.

At 1715, the method may include forming a plurality of first memory material elements coupled with the first electrode and a plurality of second memory material elements coupled with the second electrode, each first memory material element and each second memory material element at a respective first layer of the plurality of first layers. The operations of 1715 may be performed in accordance with examples as disclosed herein.

At 1720, the method may include forming one or more dielectric materials between the first electrode and the second electrode, the one or more dielectric materials electrically isolating the first electrode from the second electrode. The operations of 1720 may be performed in accordance with examples as disclosed herein.

In some examples, an apparatus as described herein may perform a method or methods, such as the method 1700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a pillar including an electrode material that extends through a stack that includes a plurality of first layers, each first layer associated with a respective word line; removing at least a portion of the electrode material of the pillar to divide the electrode material into a first electrode extending through the plurality of first layers and a second electrode extending through the plurality of first layers; forming a plurality of first memory material elements coupled with the first electrode and a plurality of second memory material elements coupled with the second electrode, each first memory material element and each second memory material element at a respective first layer of the plurality of first layers; and forming one or more dielectric materials between the first electrode and the second electrode, the one or more dielectric materials electrically isolating the first electrode from the second electrode.

Aspect 2: The method, apparatus, or non-transitory computer-readable medium of aspect 1, further including operations, features, circuitry, logic, means, or instructions, or any combination thereof for removing material from the stack to form a hole extending through the stack, where the pillar is formed in the hole.

Aspect 3: The method, apparatus, or non-transitory computer-readable medium of aspect 2, where a cross-section of the hole at a first layer of the plurality of the first layers has a first dimension in a first direction and a second dimension greater than the first dimension in a second direction.

Aspect 4: The method, apparatus, or non-transitory computer-readable medium of any of aspects 2 through 3, further including operations, features, circuitry, logic, means, or instructions, or any combination thereof for removing, via the hole, a portion of a respective sacrificial material that surrounds the hole at each first layer to form a respective cavity at each first layer, the respective cavities connected with the hole and forming, within each cavity at each first layer, a respective second sacrificial material surrounding the hole, the respective second sacrificial materials associated with the plurality of first memory material elements and the plurality of second memory material elements.

Aspect 5: The method, apparatus, or non-transitory computer-readable medium of aspect 4, where forming the pillar includes operations, features, circuitry, logic, means, or instructions, or any combination thereof for forming, within the hole, a ring of the electrode material, the ring of the electrode material extending through the stack and coupled with the respective second sacrificial materials and forming, within the ring of the electrode material, a first dielectric material extending through the stack, where the pillar includes the first dielectric material.

Aspect 6: The method, apparatus, or non-transitory computer-readable medium of aspect 5, where removing the at least the portion of the electrode material of the pillar includes operations, features, circuitry, logic, means, or instructions, or any combination thereof for removing a portion of the first dielectric material, the at least the portion of the electrode material, and a respective portion of each of the respective second sacrificial materials to form a second hole extending through the stack, the second hole dividing the ring of the electrode material into the first electrode and the second electrode.

Aspect 7: The method, apparatus, or non-transitory computer-readable medium of aspect 6, where forming the plurality of first memory material elements and the plurality of second memory material elements includes operations, features, circuitry, logic, means, or instructions, or any combination thereof for removing, via the second hole, the respective second sacrificial materials from each first layer to form a respective second cavity at each first layer; forming, within each second cavity at each first layer, a respective ring of memory material, each respective ring of memory material associated with a corresponding first memory material element of the plurality of first memory material elements and a corresponding second memory material element of the plurality of second memory material elements; and removing, via the second hole, a respective portion of each respective ring of memory material to divide the respective ring of memory material into the corresponding first memory material element and the corresponding second memory material element.

Aspect 8: The method, apparatus, or non-transitory computer-readable medium of aspect 7, further including operations, features, circuitry, logic, means, or instructions, or any combination thereof for forming a respective second dielectric material at each first layer between each corresponding first memory material element and corresponding second memory material element, the respective second dielectric material electrically isolating the corresponding first memory material element from the corresponding second memory material element.

Aspect 9: The method, apparatus, or non-transitory computer-readable medium of any of aspects 7 through 8, where forming the one or more dielectric materials between the first electrode and the second electrode includes operations, features, circuitry, logic, means, or instructions, or any combination thereof for forming, within the second hole, the one or more dielectric materials extending through the stack.

Aspect 10: The method, apparatus, or non-transitory computer-readable medium of any of aspects 1 through 9, where each first layer of the plurality of first layers includes a respective sacrificial material and the method, apparatuses, and non-transitory computer-readable medium further includes operations, features, circuitry, logic, means, or instructions, or any combination thereof for removing the respective sacrificial material from each first layer and forming a respective word line electrode material at each first layer based at least in part on removing the respective sacrificial material, where the respective word line electrode material is associated with a corresponding first memory material element of the plurality of first memory material elements and a corresponding second memory material element of the plurality of second memory material elements.

Figure 18:
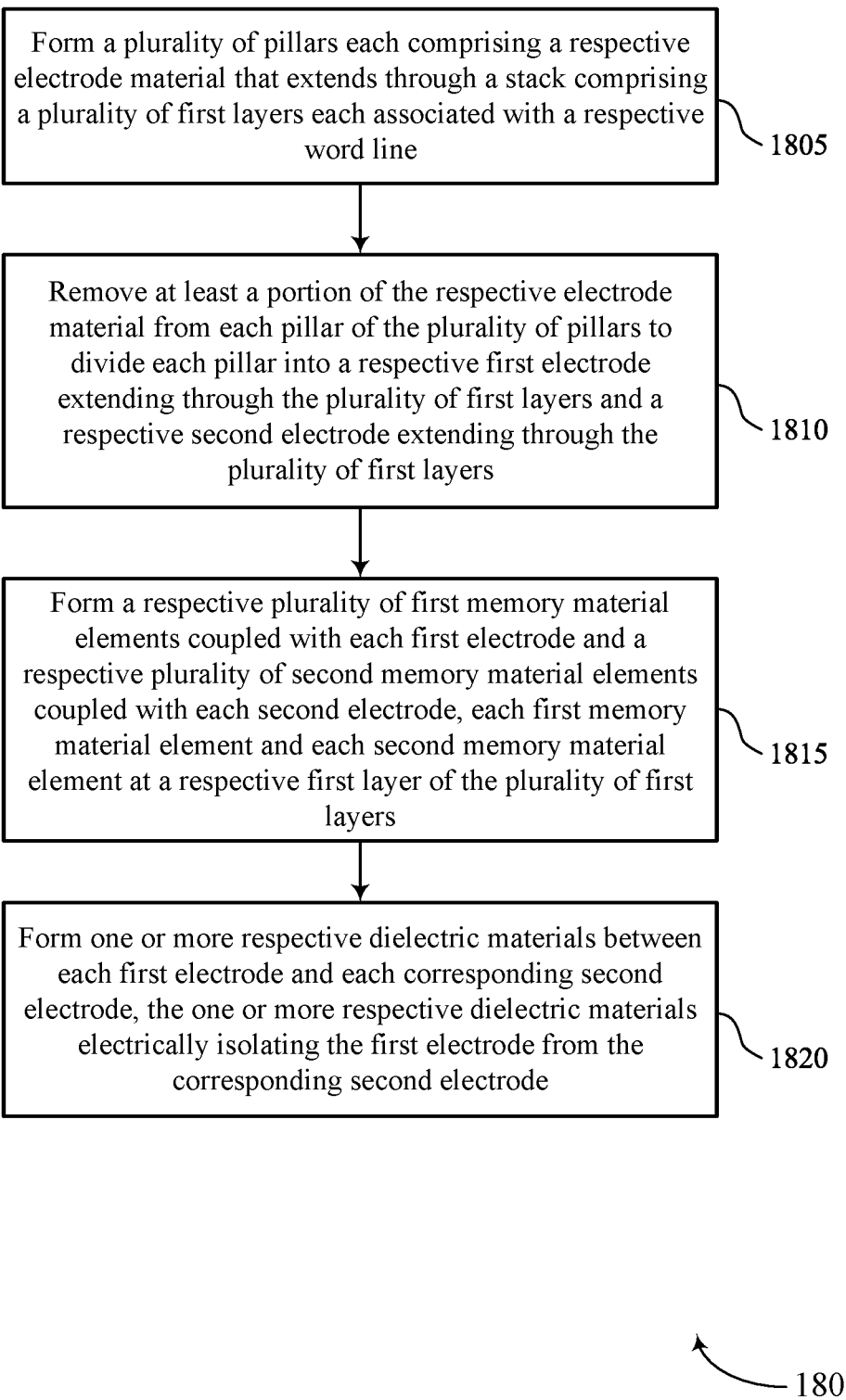

FIG. 18 shows a flowchart illustrating a method 1800 that supports a pillar and word line plate architecture for a memory array in accordance with examples as disclosed herein. The operations of method 1800 may be implemented by a manufacturing system or its components as described herein. For example, the operations of method 1800 may be performed by a manufacturing system as described with reference to FIGS. 1 through 16. In some examples, a manufacturing system may execute a set of instructions to control the functional elements of the device to perform the described functions. Additionally, or alternatively, the manufacturing system may perform aspects of the described functions using special-purpose hardware.

At 1805, the method may include forming a plurality of pillars each including a respective electrode material that extends through a stack including a plurality of first layers each associated with a respective word line. The operations of 1805 may be performed in accordance with examples as disclosed herein.

At 1810, the method may include removing at least a portion of the respective electrode material from each pillar of the plurality of pillars to divide each pillar into a respective first electrode extending through the plurality of first layers and a respective second electrode extending through the plurality of first layers. The operations of 1810 may be performed in accordance with examples as disclosed herein.

At 1815, the method may include forming a respective plurality of first memory material elements coupled with each first electrode and a respective plurality of second memory material elements coupled with each second electrode, each first memory material element and each second memory material element at a respective first layer of the plurality of first layers. The operations of 1815 may be performed in accordance with examples as disclosed herein.

At 1820, the method may include forming one or more respective dielectric materials between each first electrode and each corresponding second electrode, the one or more respective dielectric materials electrically isolating the first electrode from the corresponding second electrode. The operations of 1820 may be performed in accordance with examples as disclosed herein.

In some examples, an apparatus as described herein may perform a method or methods, such as the method 1800. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for forming a plurality of pillars each including a respective electrode material that extends through a stack including a plurality of first layers each associated with a respective word line; removing at least a portion of the respective electrode material from each pillar of the plurality of pillars to divide each pillar into a respective first electrode extending through the plurality of first layers and a respective second electrode extending through the plurality of first layers; forming a respective plurality of first memory material elements coupled with each first electrode and a respective plurality of second memory material elements coupled with each second electrode, each first memory material element and each second memory material element at a respective first layer of the plurality of first layers; and forming one or more respective dielectric materials between each first electrode and each corresponding second electrode, the one or more respective dielectric materials electrically isolating the first electrode from the corresponding second electrode.

Aspect 12: The method, apparatus, or non-transitory computer-readable medium of aspect 11, further including operations, features, circuitry, logic, means, or instructions, or any combination thereof for removing material from the stack to form a plurality of holes extending through the stack, where each pillar of the plurality of pillars is formed in a respective hole of the plurality of holes.

Aspect 13: The method, apparatus, or non-transitory computer-readable medium of aspect 12, where a cross-section of each hole of the plurality of holes at a first layer of the plurality of the first layers has a first dimension in a first direction and a second dimension greater than the first dimension in a second direction.

Aspect 14: The method, apparatus, or non-transitory computer-readable medium of any of aspects 12 through 13, further including operations, features, circuitry, logic, means, or instructions, or any combination thereof for removing, via the plurality of holes, a portion of a respective sacrificial material that surrounds each hole at each first layer to form a respective plurality of cavities at each first layer, each cavity of the respective plurality of cavities connected with a corresponding hole of the plurality of holes and forming, within each cavity of the respective plurality of cavities and at each first layer, a respective second sacrificial material surrounding the corresponding hole, the respective second sacrificial material associated with the respective plurality of first memory material elements and the respective plurality of second memory material elements.

Aspect 15: The method, apparatus, or non-transitory computer-readable medium of aspect 14, where forming the respective plurality of first memory material elements and the respective plurality of second memory material elements includes operations, features, circuitry, logic, means, or instructions, or any combination thereof for removing the respective second sacrificial materials from each first layer to form a respective second cavity at each first layer; forming, within each second cavity at each first layer, a respective ring of memory material, each respective ring of memory material associated with a corresponding first memory material element of the respective plurality of first memory material elements and a corresponding second memory material element of the respective plurality of second memory material elements; and removing a respective portion of each respective ring of memory material to divide the respective ring of memory material into the corresponding first memory material element and the corresponding second memory material element.

Aspect 16: The method, apparatus, or non-transitory computer-readable medium of aspect 15, further including operations, features, circuitry, logic, means, or instructions, or any combination thereof for forming a respective second dielectric material at each first layer between each corresponding first memory material element and corresponding second memory material element, the respective second dielectric material electrically isolating the corresponding first memory material element from the corresponding second memory material element.

Aspect 17: The method, apparatus, or non-transitory computer-readable medium of any of aspects 12 through 16, where forming the plurality of pillars includes operations, features, circuitry, logic, means, or instructions, or any combination thereof for forming, within each hole of the plurality of holes, a respective ring of the respective electrode material, each respective ring of the respective electrode material extending through the stack and forming, within each respective ring of the respective electrode material, a respective first dielectric material extending through the stack, where each pillar of the plurality of pillars includes a corresponding first dielectric material.

Aspect 18: The method, apparatus, or non-transitory computer-readable medium of aspect 17, where removing the at least the portion of the respective electrode material includes operations, features, circuitry, logic, means, or instructions, or any combination thereof for removing, from each pillar of the plurality of pillars, a respective portion of the respective first dielectric material and the at least the portion of the respective electrode material to form a plurality of second holes extending through the stack, each second hole of the plurality of second holes dividing the respective ring of the respective electrode material into the respective first electrode and the respective second electrode.

Aspect 19: The method, apparatus, or non-transitory computer-readable medium of aspect 18, where forming one or more respective dielectric materials between each first electrode and each corresponding second electrode includes operations, features, circuitry, logic, means, or instructions, or any combination thereof for forming, within each second hole of the plurality of second holes, the one or more respective dielectric materials extending through the stack.

Aspect 20: The method, apparatus, or non-transitory computer-readable medium of any of aspects 11 through 19, where each first layer of the plurality of first layers includes a respective sacrificial material and the method, apparatuses, and non-transitory computer-readable medium further includes operations, features, circuitry, logic, means, or instructions, or any combination thereof for removing the respective sacrificial material from each first layer and forming a respective word line electrode material at each first layer based at least in part on removing the respective sacrificial material, where the respective word line electrode material is associated with a corresponding first memory material element of each respective plurality of first memory material elements and a corresponding second memory material element of each respective plurality of second memory material elements.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 21: An apparatus, including: a stack including a plurality of first layers, each first layer including a respective first electrode; a plurality of first memory material elements each located at a respective first layer of the plurality of first layers and coupled with a respective first electrode; a plurality of second memory material elements each located at the respective first layer of the plurality of first layers and coupled with the respective first electrode; and a pillar extending through the plurality of first layers, the pillar including: a second electrode extending through the plurality of first layers and coupled with the plurality of first memory material elements; a third electrode extending through the plurality of first layers and coupled with the plurality of second memory material elements; and one or more dielectric materials interposed between the second electrode and the third electrode and extending through the plurality of first layers, the one or more dielectric materials electrically isolating the second electrode from the third electrode.

Aspect 22: The apparatus of aspect 21, further including: a plurality of third memory material elements each located at the respective first layer of the plurality of first layers and coupled with the respective first electrode; a plurality of fourth memory material elements each located at the respective first layer of the plurality of first layers and coupled with the respective first electrode; and a second pillar extending through the plurality of first layers, the second pillar including: a fourth electrode extending through the plurality of first layers and coupled with the plurality of third memory material elements; a fifth electrode extending through the plurality of first layers and coupled with the plurality of fourth memory material elements; and one or more second dielectric materials interposed between the fourth electrode and the fifth electrode and extending through the plurality of first layers, the one or more second dielectric materials electrically isolating the fourth electrode from the fifth electrode.

Aspect 23: The apparatus of any of aspects 21 through 22, further including: a respective sixth electrode at each first layer of the plurality of first layers of the stack, where the respective sixth electrode is isolated from the respective first electrode at a corresponding first layer of the plurality of first layers; a plurality of fifth memory material elements each located at a respective first layer of the plurality of first layers and coupled with a respective sixth electrode; a plurality of sixth memory material elements each located at the respective first layer of the plurality of first layers and coupled with the respective sixth electrode; and a third pillar extending through the plurality of first layers, the third pillar including: a seventh electrode extending through the plurality of first layers and coupled with the plurality of fifth memory material elements; an eighth electrode extending through the plurality of first layers and coupled with the plurality of sixth memory material elements; and one or more third dielectric materials interposed between the seventh electrode and the eighth electrode and extending through the plurality of first layers, the one or more third dielectric materials electrically isolating the seventh electrode from the eighth electrode.

Aspect 24: The apparatus of any of aspects 21 through 23, where the stack further includes a plurality of second layers, each second layer interposed between a corresponding set of two first layers of the plurality of first layers and configured to isolate one first layer of the set of two first layers from another first layer of the set of two first layers.

Aspect 25: The apparatus of any of aspects 21 through 24, a respective first dielectric material interposed between each first memory material element of the plurality of first memory material elements and a corresponding second memory material element of the plurality of first memory material elements, the respective first dielectric material electrically isolating the first memory material element and the corresponding second memory material element.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as any combination of computing devices (e.g., any combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a stack comprising a plurality of first layers, each first layer comprising a respective first electrode;
a plurality of first memory material elements each located at a respective first layer of the plurality of first layers and coupled with a respective first electrode;
a plurality of second memory material elements each located at the respective first layer of the plurality of first layers and coupled with the respective first electrode; and
a pillar extending through the plurality of first layers, the pillar comprising:
a second electrode extending through the plurality of first layers and coupled with the plurality of first memory material elements;
a third electrode extending through the plurality of first layers and coupled with the plurality of second memory material elements; and
one or more dielectric materials interposed between the second electrode and the third electrode and extending through the plurality of first layers, the one or more dielectric materials electrically isolating the second electrode from the third electrode.

2. The apparatus of claim 1, further comprising:
a plurality of third memory material elements each located at the respective first layer of the plurality of first layers and coupled with the respective first electrode;
a plurality of fourth memory material elements each located at the respective first layer of the plurality of first layers and coupled with the respective first electrode; and
a second pillar extending through the plurality of first layers, the second pillar comprising:
a fourth electrode extending through the plurality of first layers and coupled with the plurality of third memory material elements;
a fifth electrode extending through the plurality of first layers and coupled with the plurality of fourth memory material elements; and
one or more second dielectric materials interposed between the fourth electrode and the fifth electrode and extending through the plurality of first layers, the one or more second dielectric materials electrically isolating the fourth electrode from the fifth electrode.

3. The apparatus of claim 1, further comprising:
a respective sixth electrode at each first layer of the plurality of first layers of the stack, wherein the respective sixth electrode is isolated from the respective first electrode at a corresponding first layer of the plurality of first layers;
a plurality of fifth memory material elements each located at a respective first layer of the plurality of first layers and coupled with a respective sixth electrode;
a plurality of sixth memory material elements each located at the respective first layer of the plurality of first layers and coupled with the respective sixth electrode; and
a third pillar extending through the plurality of first layers, the third pillar comprising:
a seventh electrode extending through the plurality of first layers and coupled with the plurality of fifth memory material elements;
an eighth electrode extending through the plurality of first layers and coupled with the plurality of sixth memory material elements; and
one or more third dielectric materials interposed between the seventh electrode and the eighth electrode and extending through the plurality of first layers, the one or more third dielectric materials electrically isolating the seventh electrode from the eighth electrode.

4. The apparatus of claim 1, wherein the stack further comprises a plurality of second layers, each second layer interposed between a corresponding set of two first layers of the plurality of first layers and configured to isolate one first layer of the set of two first layers from another first layer of the set of two first layers.

5. The apparatus of claim 1, a respective first dielectric material interposed between each first memory material element of the plurality of first memory material elements and a corresponding second memory material element of the plurality of first memory material elements, the respective first dielectric material electrically isolating the first memory material element and the corresponding second memory material element.

* * * * *